(12) United States Patent
Tamamushi

(10) Patent No.: US 11,227,773 B2
(45) Date of Patent: Jan. 18, 2022

(54) METHOD FOR CONTROLLING ELECTROSTATIC CHUCK AND PLASMA PROCESSING APPARATUS

(71) Applicant: Tokyo Electron Limited, Tokyo (JP)

(72) Inventor: Gen Tamamushi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/741,875

(22) Filed: Jan. 14, 2020

(65) Prior Publication Data

US 2020/0234931 A1  Jul. 23, 2020

(30) Foreign Application Priority Data

Jan. 17, 2019 (JP) .............................. JP2019-006075
Dec. 17, 2019 (JP) .............................. JP2019-227207

(51) Int. Cl.
*H01L 21/306* (2006.01)
*H01L 21/3065* (2006.01)
*H01J 37/32* (2006.01)
*B08B 7/00* (2006.01)

(52) U.S. Cl.
CPC ........ *H01L 21/3065* (2013.01); *B08B 7/0035* (2013.01); *H01J 37/3244* (2013.01); *H01J 37/32651* (2013.01); *H01J 37/32706* (2013.01); *H01J 37/32724* (2013.01); *H01L 21/30621* (2013.01); *H01J 37/32091* (2013.01); *H01J 2237/002* (2013.01); *H01J 2237/334* (2013.01); *H01J 2237/335* (2013.01)

(58) Field of Classification Search
CPC ........... H01J 37/32706; H01J 37/32724; H01J 37/32651; H01J 37/3244; H01J 37/32091; H01J 2237/002; H01J 2237/335; H01J 2237/334; H01J 37/32715; H01J 37/32449; H01J 37/32532; H01J 37/32697; H01L 21/30621; H01L 21/3065; B08B 7/0035; C23C 16/503; C23C 16/505; C23C 16/509
USPC ............... 216/67; 438/706–714; 156/345.28, 156/345.34, 345.44
See application file for complete search history.

(56) References Cited

U.S. PATENT DOCUMENTS

2016/0336185 A1\* 11/2016 Ishiguro ............ H01J 37/32706
2017/0207110 A1\* 7/2017 Satoh ................ H01L 21/67069
2018/0350565 A1\* 12/2018 Matsuyama ........ H01L 21/6833

FOREIGN PATENT DOCUMENTS

JP       2015-216261 A      12/2015

\* cited by examiner

*Primary Examiner* — Duy Vu N Deo
(74) *Attorney, Agent, or Firm* — Nath, Goldberg & Meyer; Jerald L. Meyer; Tanya E. Harkins

(57) ABSTRACT

A method for controlling an electrostatic attractor, which attracts an electrode to a gas plate provided in an upper portion of a plasma processing apparatus, includes, among a plasma generation period in which plasma is generated by the plasma processing apparatus and an idle period in which no plasma is generated by the plasma processing apparatus, applying voltages having polarities different from each other to first and second electrodes of the electrostatic attractor in at least the idle period.

11 Claims, 21 Drawing Sheets

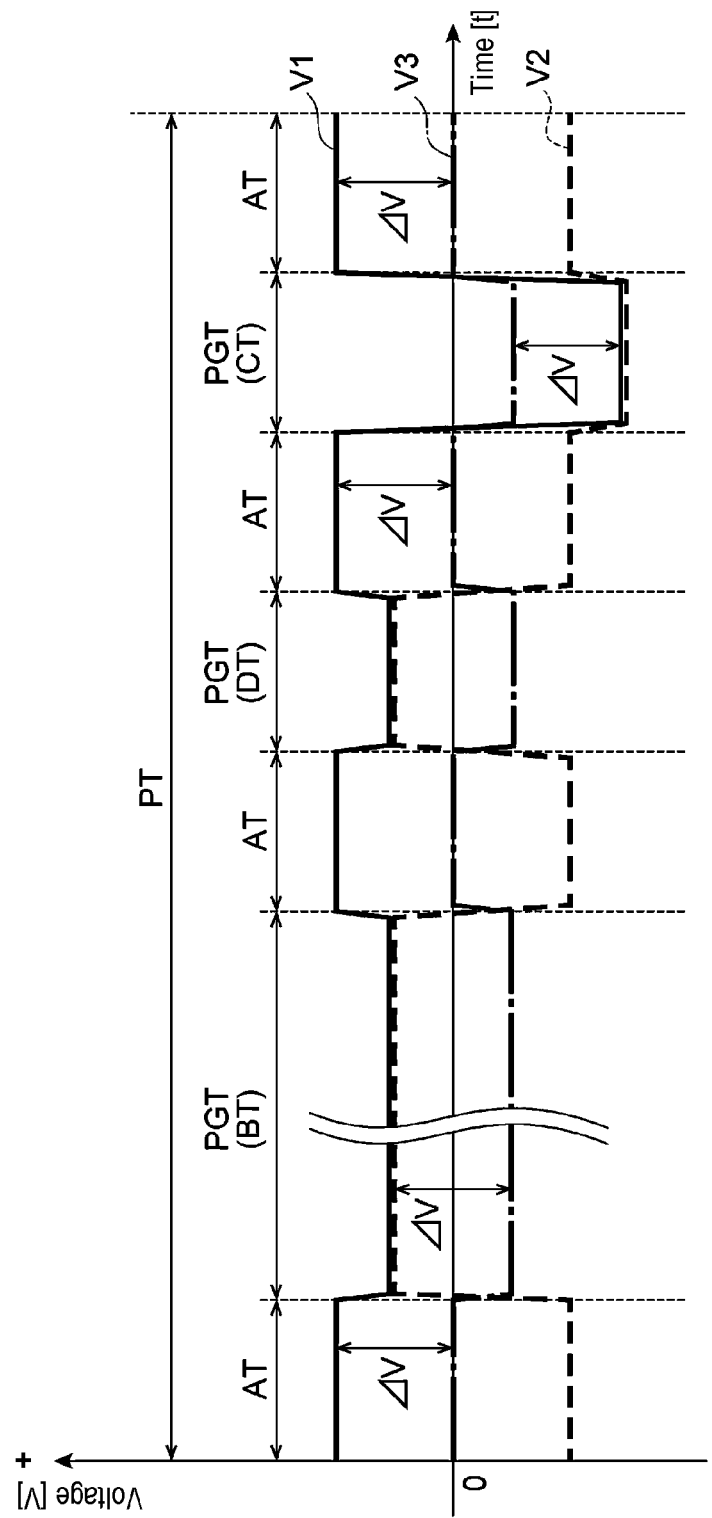

METHOD FOR CONTROLLING ELECTROSTATIC CHUCK AND PLASMA PROCESSING APPARATUS

CROSS-REFERENCE TO RELATED APPLICATIONS

This application is based upon and claims the benefit of priority from Japanese Patent Application No. 2019-006075, filed on Jan. 17, 2019, and Japanese Patent Application No. 2019-227207, filed on Dec. 17, 2019, the entire contents of which are incorporated herein by reference.

TECHNICAL FIELD

The present disclosure relates to a method for controlling an electrostatic attractor and a plasma processing apparatus.

BACKGROUND

A structure for attracting an electrode on an upper electrode of a plasma processing apparatus is disclosed in Patent Document 1. An electrostatic attractor is interposed between the electrode and a plate in contact with the electrode. The electrostatic attractor is formed of ceramic, and is fixed to a lower surface of the plate via a clamp.

PRIOR ART DOCUMENT

Patent Document

Patent Document 1: Japanese laid-open publication No. 2015-216261

SUMMARY

Some embodiments of the present disclosure provide a method for controlling an electrostatic attractor that attracts an electrode to a gas plate provided in an upper portion of a plasma processing apparatus. The method includes a voltage applying process. In the voltage applying process, among a plasma generation period and an idle period, voltages having polarities different from each other are applied to first and second electrodes of the electrostatic attractor in at least the idle period. In the plasma generation period, plasma is generated by the plasma processing apparatus. During the idle period, no plasma is generated by the plasma processing apparatus.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 21 is a graph illustrating an example of the relationship between voltages applied to the first electrode and the second electrode and a time.

DETAILED DESCRIPTION

Figure 1:
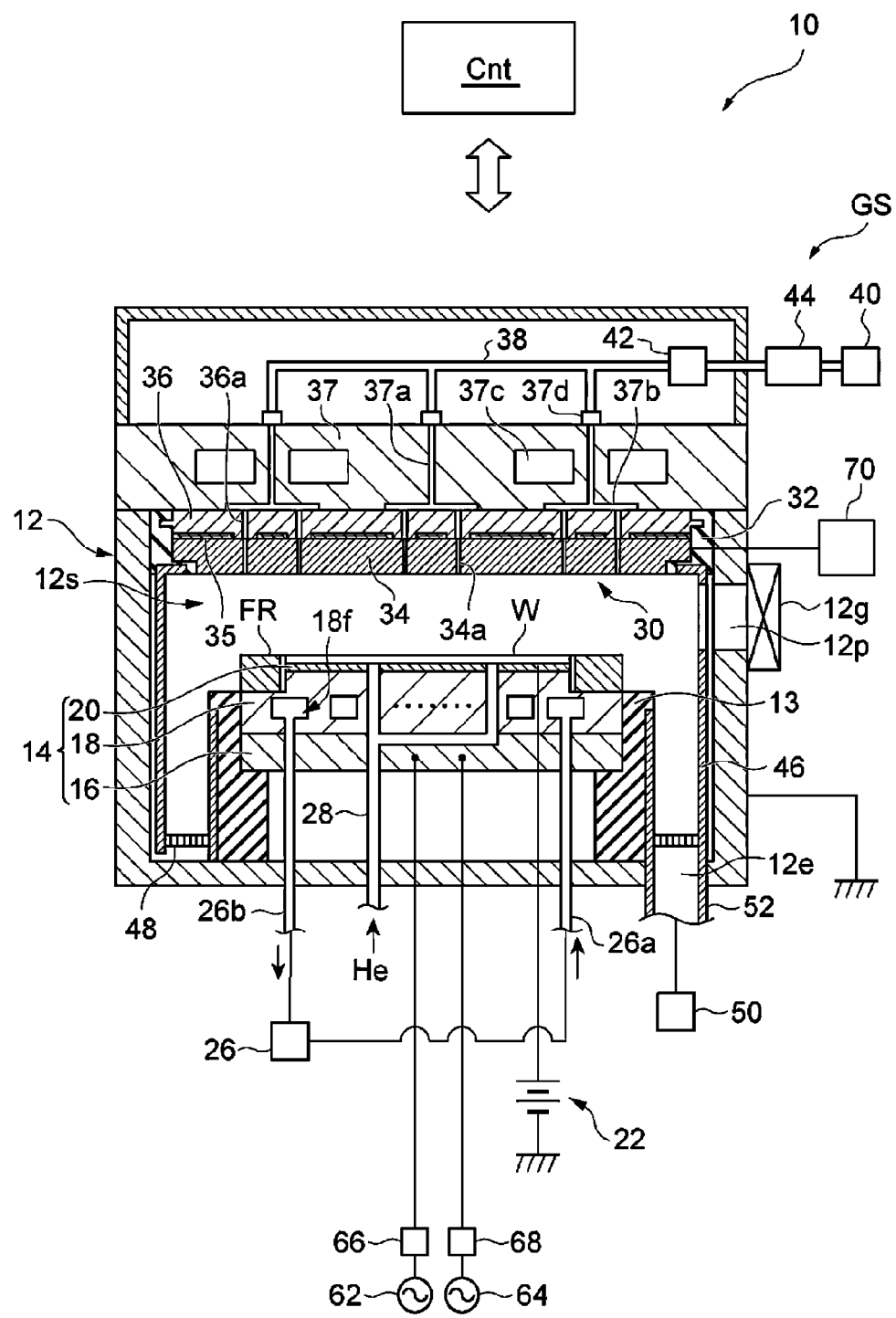
FIG. 1 is a view schematically illustrating a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An aspect of the present disclosure provides an upper electrode of a plasma processing apparatus. The upper electrode includes an electrode, a gas plate, an electrostatic attractor, and a shield. Gas discharge holes passing through the electrode are formed in the electrode. Gas flow passages are used to supply processing gas to the gas discharge holes. The gas flow passages are formed in the gas plate at locations facing the gas discharge holes. The electrostatic attractor is interposed between the electrode and the gas plate, and has a contact surface in contact with a lower surface of the gas plate and an attraction surface attracting an upper surface of the electrode. The shield shields radicals or gases moving from the gas discharge holes to a space between the electrode and the gas plate.

In the case where the electrostatic attractor is interposed between the electrode and the gas plate, a gap is formed between upper ends of the gas discharge holes in the electrode and lower ends of the gas flow passages in the gas plate. Since the electrode faces plasma, there is a concern that radicals or gases intrude from the gas discharge holes in the electrode and enter the gap. These radicals or gases may erode and abrade the electrostatic attractor.

In the upper electrode, the shield shields the radicals or gases moving from the gas discharge holes to the space between the electrode and the gas plate. Therefore, the upper electrode can suppress the electrostatic attractor from being exhausted by the radicals or gases.

In some embodiments, the shield may have a connector, which is interposed between the electrode and the gas plate and connects the gas discharge holes and the gas flow passages. In this configuration, the connector can physically shield the radicals or gases moving from the gas discharge holes to the space between the electrode and the gas plate.

In some embodiments, the lower surface of the gas plate may have a first region facing the contact surface of the electrostatic attractor and a second region facing the gas discharge holes. The connector may have an upper end connected to the second region in the lower surface of the gas plate, and a lower end connected to the upper surface of the electrode. Flow passages may be defined in the connector. Through the flow passages, the gas discharge holes and the gas flow passages communicate with each other. In this configuration, the gas discharge holes and the gas flow passages can communicate with each other while the connector physically shields the radicals or gases moving from the gas discharge holes to the space between the electrode and the gas plate.

In some embodiments, the connector may be integral with the gas plate or with the electrode. In this configuration, it is possible to suppress the electrostatic attractor from being exhausted by the radicals or gases without an increase of the number of components.

In some embodiments, the connector may have an upper connector integrated with the gas plate, and a lower connector integrated with the electrode and being in contact with the upper connector. In this configuration, it is possible to suppress the electrostatic attractor from being exhausted by the radicals or gases without an increase of the number of components.

In some embodiments, the gas plate may have a passivation layer at a location in contact with the electrode. In this configuration, it is possible to prevent the location at which the gas plate is in contact with the electrode from being altered.

In some embodiments, the connector may be separate from the electrode and the gas plate. In this configuration, it is possible to suppress the electrostatic attractor from being exhausted by the radicals or gases without changing the existing electrode and the existing gas plate.

In some embodiments, the electrostatic attractor may have a main body formed of an elastic dielectric, and an electrostatic attraction electrode disposed in the main body. The main body of the electrostatic attractor is disposed between the electrode and the gas plate in a state where the main body is compressed, and the compressed main body has the same thickness as that of the connector. In this configuration, the electrostatic attractor can be disposed without interfering with the contact of the electrode with the gas plate.

In some embodiments, the lower surface of the gas plate may have a first region facing the contact surface of the electrostatic attractor and the second region facing the gas discharge holes. A gap may be defined by the second region and the upper surface of the electrode. The shield may have a depressurizing exhaust device and exhaust flow passages connected to the exhaust device. The exhaust flow passages may be formed in the gas plate and have a lower end located in the second region. The exhaust device may depressurize a space in the gap through the exhaust flow passages. With this configuration, the radicals or gases moving from the gas discharge hole to the space between the electrode and the gas plate can be suctioned from the exhaust flow passages prior to reaching the electrostatic attractor. Therefore, it is possible to suppress the electrostatic attractor from being exhausted by the radicals or gases.

In some embodiments, the lower surface of the gas plate may have a first region facing the contact surface of the electrostatic attraction part and the second region facing the gas discharge holes. A gap may be defined by the second region and the upper surface of the electrode. The shield may have a gas source of a shielding gas, and supply flow passages connected to the gas source. The supply flow passages may be formed in the gas plate and have a lower end located in the second region, and may supply the shielding gas from the gas source to a space in the gap. In this configuration, the radicals or gases moving from the gas discharge holes to the space between the electrode and the gas plate can be shielded by the shielding gas prior to reaching the electrostatic attractor. Therefore, it is possible to suppress the electrostatic attractor from being exhausted by the radicals or gases.

In some embodiments, components of the shielding gas may be the same as those of a processing gas. In this configuration, an influence of the shielding gas acting on a process can be reduced.

In some embodiments, a flow passage through which a coolant circulates may be formed in the gas plate. In this configuration, since a temperature of the gas plate can be directly adjusted, heat exchange between the gas plate and the electrode can be efficiently performed.

In some embodiments, the upper electrode may further include a cooler having a flow passage through which a coolant circulates is formed in the cooler and being in contact with an upper surface of the gas plate. In this configuration, the electrode can be cooled without machining the gas plate having the gas flow passages.

In some embodiments, the electrostatic attractor may have a first attraction part and a second attraction part. The first attraction part may have a first main body formed of a dielectric having elasticity, and a first electrode disposed in the first main body. The second attraction part may have a second main body formed of a dielectric having elasticity, and a second electrode disposed in the second main body. Voltages having polarities different from each other may be applied to the first electrode and the second electrode. In this configuration, the electrode can be attracted in a bipolar manner.

In some embodiments, the electrostatic attractor may have a first attraction part and a second attraction part. The first attraction part may have a first main body formed of a dielectric having elasticity, and a first electrode disposed in the first main body. The second attraction part may have a second main body formed of a dielectric having elasticity, and a second electrode that is disposed in the second main body. Voltages having the same polarity may be applied to the first electrode and the second electrode. In this configuration, the electrode can be attracted in a unipolar manner.

Another aspect of the present disclosure provides a plasma processing apparatus. The plasma processing apparatus include a chamber, a substrate holder, and an upper electrode. The substrate holder is configured to support a substrate in the chamber. The upper electrode forms an upper portion of the chamber. The upper electrode has an electrode, a gas plate, an electrostatic attractor, and a shield. Gas discharge holes are formed in the electrode. Gas flow passages via which a processing gas is supplied to the gas discharge holes are formed in the gas plate at locations where the gas flow passages face the gas discharge holes. The electrostatic attractor is interposed between the electrode and the gas plate, and has a contact surface in contact with a lower surface of the gas plate and an attraction surface attracting an upper surface of the electrode. The shield shields radicals or gases moving from the gas discharge holes to a space between the electrode and the gas plate.

In this configuration, the shield shields the radicals or gases moving from the gas discharge holes to the space between the electrode and the gas plate. Therefore, the plasma processing apparatus can suppress the electrostatic attractor from being exhausted by the radicals or gases.

Another aspect of the present disclosure provides a method for assembling an upper electrode of the plasma processing apparatus. The method includes a bonding process, a positioning process, and an installing process. In the bonding process, an upper surface of the electrostatic attractor is bonded to a lower surface of the gas plate. In the bonding process, a lower surface of the gas plate has a first region bonded with the upper surface of the electrostatic attractor, and a second region having gas flow passages extending in a thickness direction. The electrostatic attractor has a main body formed of an elastic dielectric, and an electrostatic attraction electrode disposed in the main body. In the positioning process, the upper surface of the electrode and the lower surface of the gas plate are positioned with each other to satisfy the following condition. The condition includes locating a connector thinner than the electrostatic attractor at a location between the upper surface of the electrode and the second region in the lower surface of the gas plate. The condition includes allowing the gas discharge holes are formed in the electrode in the thickness direction to face the gas flow passages. The condition includes allowing the upper surface of the electrode to be in contact with the lower surface of the electrostatic attractor. In the installing process, a support member supporting the positioned electrode is installed at the gas plate.

In this configuration, the upper electrode, in which the connector physically shields the radicals or gases moving from the gas discharge holes to the space between the electrode and the gas plat, can be assembled. In a case where the electrostatic attractor has elasticity, when the electrode is attracted by the electrostatic attractor and is pressed against the gas plate, there is a concern that a thickness of the electrostatic attractor varies according to an attractive force. Thus, there is a concern that the thickness of the electrostatic attractor may be changed. Such a change in the thickness influences on accuracy of temperature adjustment of the electrode, and further influences on accuracy of plasma processing. In the method of the present disclosure, the connector thinner than the electrostatic attractor having elasticity is located between the upper surface of the electrode and the second region in the lower surface of the gas plate. When the electrode is attracted by the electrostatic attractor and is pressed against the gas plate, the electrostatic attractor is compressed between the upper surface of the electrode and the lower surface of the gas plate. Thus, since the upper surface of the electrode is brought into contact with the connector, positioning in a height direction (the thickness direction) can be performed. Therefore, according to the method of the present disclosure, it is possible to suppress the accuracy of temperature adjustment of the electrode from being reduced.

Another aspect of the present disclosure provides a method for controlling an electrostatic attractor that attracts an electrode to a temperature-controlled gas plate provided in an upper portion of a plasma processing apparatus. The controlling method includes a voltage applying process. In the voltage applying process, among a plasma generation period and an idle period, voltages having polarities different from each other are applied to first and second electrodes of the electrostatic attractor in at least the idle period. In the plasma generation period, plasma is generated by the plasma processing apparatus. In the idle period, no plasma is generated by the plasma processing apparatus.

In some embodiments, in the idle period in which no plasma is generated, the electrode may be attracted to the temperature-controlled gas plate. In the plasma generation period in which plasma is generated, a temperature of the electrode may be increased by heat provided from the plasma. Thus, it is necessary to attract the electrode to the temperature-controlled gas plate so as to perform temperature adjustment. In this configuration, the temperature adjustment is performed even in the idle period in which no heat is provided from the plasma. Thus, the temperature adjustment during a subsequent plasma generation period can be efficiently performed.

In some embodiments, a process period of the plasma processing apparatus may include the plasma generation period and the idle period which are alternatingly repeated. In the applying the voltages having polarities different from each other, the polarities of the voltages applied to the first electrode and the second electrode may be switched every idle period. In this configuration, the polarities of the electrodes are not fixed to one of a positive polarity and a negative polarity. Thus, it is possible to prevent electric charges from moving in one direction (migration) and possible to avoid reduction in attractive forces.

In some embodiments, the control method may further include applying a negative voltage to the electrode in the plasma generation period.

In some embodiments, the control method may further include applying voltages having the same polarity to the first electrode and the second electrode in the plasma generation period. In this configuration, the electrode can be attracted in the plasma generation period in a unipolar manner having an attractive force stronger than that in a bipolar manner.

In some embodiments, the control method may further include applying a voltage to the electrode and applying positive voltages to the first electrode and the second electrode, respectively, during the plasma generation period. In this configuration, the electrode can be attracted when plasma is generated by applying the negative voltage to the electrode.

In some embodiments, in the applying the voltages having the same polarity, voltages may be applied to the first electrode and the second electrode so as to satisfy a condition. The condition may be setting a difference between the positive voltages applied to the first electrode and the second electrode and the negative voltage applied to the electrode to be equal to a magnitude of the voltages applied in the idle period. In this configuration, since magnitudes of the positive voltages applied to the first electrode and the second electrode can be reduced by as much as a magnitude of the negative voltage applied to the electrode, it is possible to reduce power consumption.

In some embodiments, the negative voltage may be applied to the electrode using a direct current power supply connected to the electrode. In this configuration, the magnitudes of the positive voltages applied to the first electrode and the second electrode can be reduced in response to the negative voltage applied to the electrode from the direct current power supply can be reduced.

In some embodiments, the negative voltage may be applied to the electrode using a high frequency power supply connected to the electrode. In this configuration, the magnitudes of the positive voltages applied to the first electrode and the second electrode can be reduced in response to a self-bias generated at the electrode.

Another aspect of the present disclosure provides a plasma processing apparatus. The plasma processing apparatus includes a chamber, a substrate holder, an upper electrode, a first power supply, a second power supply, and a controller. The substrate holder is configured to support a substrate in the chamber. The upper electrode forms an upper portion of the chamber. The upper electrode includes a temperature-controlled gas plate, an electrode in contact with a lower surface of the plate, and an electrostatic attractor having a first electrode and a second electrode. The electrostatic attractor is interposed between the electrode and the plate, and has a contact surface that is in contact with the lower surface of the plate and an attraction surface attracting an upper surface of the electrode. The controller performs a control, during a plasma generation period and an idle period, to apply voltages having polarities different from each other to the first and second electrodes of the electrostatic attractor in at least the idle period. In the plasma generation period, plasma is generated by the plasma processing apparatus. In the idle period, no plasma is generated by the plasma processing apparatus.

In some embodiment, during the idle period in which no plasma is generated, the electrode can be attracted to the temperature-controlled gas plate. In the plasma generation period in which the plasma is generated, a temperature of the electrode increases due to heat input from the plasma. Thus, when the heat is input from the plasma, it is necessary to attract the electrode to the temperature-controlled gas plate so as to perform temperature adjustment. With this configuration, the temperature adjustment is performed even in the idle period in which no heat is input from the plasma. Thus, temperature adjustment in a subsequent plasma generation period can be efficiently performed.

Hereinafter, various embodiments will be described in detail with reference to the drawings. Further, the same reference numerals or symbols are designated to identical or equivalent portions in the drawings.

[Overview of Plasma Processing Apparatus]

FIG. 1 is a view schematically illustrating a plasma processing apparatus according to an embodiment. A plasma processing apparatus 10 illustrated in FIG. 1 is a capacitively coupled plasma etching apparatus. The plasma processing apparatus 10 includes a chamber main body 12. The chamber main body 12 has a substantially cylindrical shape, and provides an internal space 12s. The chamber main body 12 is formed of, for example, aluminum. An inner wall surface of the chamber main body 12 has plasma resistivity due to treatment, for example, an anodizing treatment may be performed on the inner wall surface of the chamber main body 12. The chamber main body 12 is electrically grounded.

A passage 12p is formed in a sidewall of the chamber main body 12. A workpiece W passes through the passage 12p when the workpiece W is loaded into the internal space 12s or unloaded from the internal space 12s. The passage 12p can be opened and closed by a gate valve 12g.

A support 13 is provided on a bottom portion of the chamber main body 12. The support 13 is formed of an insulating material. The support 13 has a substantially cylindrical shape. The support 13 vertically extends from the bottom portion of the chamber main body 12 in the internal space 12s. The support 13 supports a stage 14. The stage 14 is provided in the internal space 12s.

The stage 14 (an example of the substrate holder) has a lower electrode 18 and an electrostatic chuck 20. The stage 14 may further include an electrode 16. The electrode 16 may be a plate. The electrode 16 is formed of, for example, a conductive material such as aluminum, and has a substantially disc shape. The lower electrode 18 is provided on the electrode 16. The lower electrode 18 is formed of, for example, a conductive material such as aluminum, and has a substantially disc shape. The lower electrode 18 is electrically connected to the electrode 16.

The electrostatic chuck 20 is provided on the lower electrode 18. The workpiece W is mounted on an upper surface of the electrostatic chuck 20. The electrostatic chuck 20 has a main body formed of a dielectric. A film-type electrode is provided in the main body of the electrostatic chuck 20. The electrode of the electrostatic chuck 20 is connected to a direct current power supply 22 through a switch. When a voltage from the direct current power supply 22 is applied to the electrode of the electrostatic chuck 20, an electrostatic attractive force is formed between the electrostatic chuck 20 and the workpiece W. The workpiece W is attracted to the electrostatic chuck 20 by the electrostatic attractive force, and is held by the electrostatic chuck 20.

An edge ring FR is disposed on the stage 14 so as to surround an edge of the workpiece W. The edge ring FR is provided in order to improve in-plane etching uniformity. Although not limited, the edge ring FR may be formed of silicon, silicon carbide, or quartz.

A flow passage 18f is provided in the lower electrode 18. A coolant is supplied from a chiller unit 26 provided outside the chamber main body 12 to the flow passage 18f through a pipe 26a. The coolant supplied to the flow passage 18f returns to the chiller unit 26 through a pipe 26b. In the plasma processing apparatus 10, a temperature of the workpiece W mounted on the electrostatic chuck 20 is adjusted by exchanging heat between the coolant and the lower electrode 18.

The plasma processing apparatus 10 has a gas supply line 28. The gas supply line 28 supplies a heat transfer gas, for example, a He gas, from a heat transfer gas supply mechanism to a gap between the upper surface of the electrostatic chuck 20 and a rear surface of the workpiece W.

The plasma processing apparatus 10 further includes an upper electrode 30. The upper electrode 30 is provided above the stage 14. The upper electrode 30 is supported in an upper portion of the chamber main body 12 via a member 32. The member 32 is formed of an insulating material. The upper electrode 30 includes an electrode 34, an electrostatic chuck 35 (an example of the electrostatic attractor), and a gas plate 36. The electrode 34 may be a plate. A lower surface of the electrode 34 faces the internal space 12s and defines the internal space 12s. The electrode 34 may be formed of a conductor or semiconductor, which has a low electric resistance and generates a small amount of Joule heating. A plurality of gas discharge holes 34a are formed in the electrode 34. The plurality of gas discharge holes 34a passes through the electrode 34 in a thickness direction of the electrode 34.

The gas plate 36 may be formed of a conductive material such as aluminum. The electrostatic chuck 35 is disposed between the gas plate 36 and the electrode 34. An exemplary configuration and voltage supply system of the electrostatic chuck 35 will be described later. The gas plate 36 and the electrode 34 are brought into close contact with each other by an attractive force of the electrostatic chuck 35.

A cooling plate 37 (an example of the cooler) is disposed on the gas plate 36. The cooling plate 37 may be formed of a conductive material such as aluminum. A flow passage 37c is provided in the cooling plate 37. A coolant is supplied from a chiller unit (not illustrated) provided outside the chamber main body 12 to the flow passage 37c. The coolant supplied to the flow passage 37c returns to the chiller unit. Thus, a temperature of the cooling plate 37 is adjusted. In the plasma processing apparatus 10, a temperature of the electrode 34 is adjusted by exchanging heat between the coolant and the gas plate 36 and between the coolant and the cooling plate 37.

A plurality of gas introduction passages 37a extends downward in the cooling plate 37. A plurality of gas diffusion chambers 37b corresponding to the plurality of gas introduction passages 37a is provided between an upper surface of the gas plate 36 and a lower surface of the cooling plate 37. A plurality of gas flow passages 36a is provided in the gas plate 36. The gas flow passages 36a are formed at locations facing the gas discharge holes 34a and extend in a thickness direction. The gas flow passages 36a extend downward from the gas diffusion chambers 37b so as to communicate with the gas discharge holes 34a. A plurality of gas introduction ports 37d, via which a processing gas is introduced to the plurality of gas diffusion chambers 37b, is formed in the cooling plate 37. A gas supply pipe 38 is connected to the gas introduction ports 37d.

A gas supply part GS is connected to the gas supply pipe 38. In the present embodiment, the gas supply part GS includes a gas source group 40, a valve group 42, and a flow rate controller group 44. The gas source group 40 is connected to the gas supply pipe 38 through the flow rate controller group 44 and the valve group 42. The gas source group 40 includes a plurality of gas sources. The plurality of gas sources includes sources of a plurality of gases forming the processing gas used in a method MT. The valve group 42 includes a plurality of opening/closing valves. The flow rate controller group 44 includes a plurality of flow rate controllers. Each of the plurality of flow rate controllers is a mass flow controller or a pressure-controlled flow rate controller. The plurality of gas sources of the gas source group 40 is connected to the gas supply pipe 38 through the valves of the valve group 42 and the flow rate controllers of the flow rate controller group 44.

In the plasma processing apparatus 10, a shield 46 is detachably provided along an inner wall of the chamber main body 12. The shield 46 is also provided on an outer circumference of the support 13. The shield 46 prevents etching by-products from adhering to the chamber main body 12. The shield 46 is formed by, for example, coating an aluminum member with ceramics such as $Y_2O_3$.

A baffle plate 48 is provided between the support 13 and the sidewall of the chamber main body 12. The baffle plate 48 may be formed by coating an aluminum member with ceramics such as $Y_2O_3$. A plurality of through-holes is formed in the baffle plate 48. An exhaust port 12e is formed below the baffle plate 48 and in the bottom portion of the chamber main body 12. An exhaust mechanism 50 is connected to the exhaust port 12e through an exhaust pipe 52. The exhaust mechanism 50 has a pressure control valve, and a vacuum pump such as a turbo-molecular pump.

The plasma processing apparatus 10 further includes a first high frequency power supply 62 and a second high frequency power supply 64. The first high frequency power supply 62 generates a first high frequency (high frequency power) for plasma generation. The first high frequency may be within a range of 27 MHz to 100 MHz. The first high frequency power supply 62 is connected to the lower electrode 18 through a matching device 66 and the electrode 16. The matching device 66 has a circuit for matching an output impedance of the first high frequency power supply 62 and an input impedance of a load side (a side of the lower electrode 18). Further, the first high frequency power supply 62 may be connected to the upper electrode 30 through the matching device 66.

The second high frequency power supply 64 generates a second high frequency (another high frequency power) for introducing ions to the workpiece W. The second high frequency is lower than the first high frequency. The second high frequency is, for example, within a range of 400 kHz to 13.56 MHz. The second high frequency power supply 64 is connected to the lower electrode 18 through a matching device 68 and the electrode 16. The matching device 68 has a circuit for matching an output impedance of the second high frequency power supply 64 and the input impedance of the load side (the side of the lower electrode 18).

The plasma processing apparatus 10 may further include a direct current power source 70. The direct current power source 70 is connected to the upper electrode 30. The direct current power source 70 is configured to generate a negative direct current voltage and supply the direct current voltage to the upper electrode 30.

The plasma processing apparatus 10 may further include a controller Cnt. The controller Cnt may be a computer having a processor, a storage, an input device, a display device, and the like. The controller Cnt controls respective components of the plasma processing apparatus 10. An operator can perform, for example, an input operation of a command to manage the plasma processing apparatus 10 using the input device of the controller Cnt. Further, the display device of the controller Cnt can visualize and display an operation situation of the plasma processing apparatus 10. Further, a control program and recipe data for controlling various processes executed in the plasma processing apparatus 10 by the processor are stored in the storage of the controller Cnt. The processor of the controller Cnt executes the control program and controls the respective components of the plasma processing apparatus 10 according to the recipe data, whereby the method to be described later is performed in the plasma processing apparatus 10.

[Overview of Upper Electrode]

Figure 2:
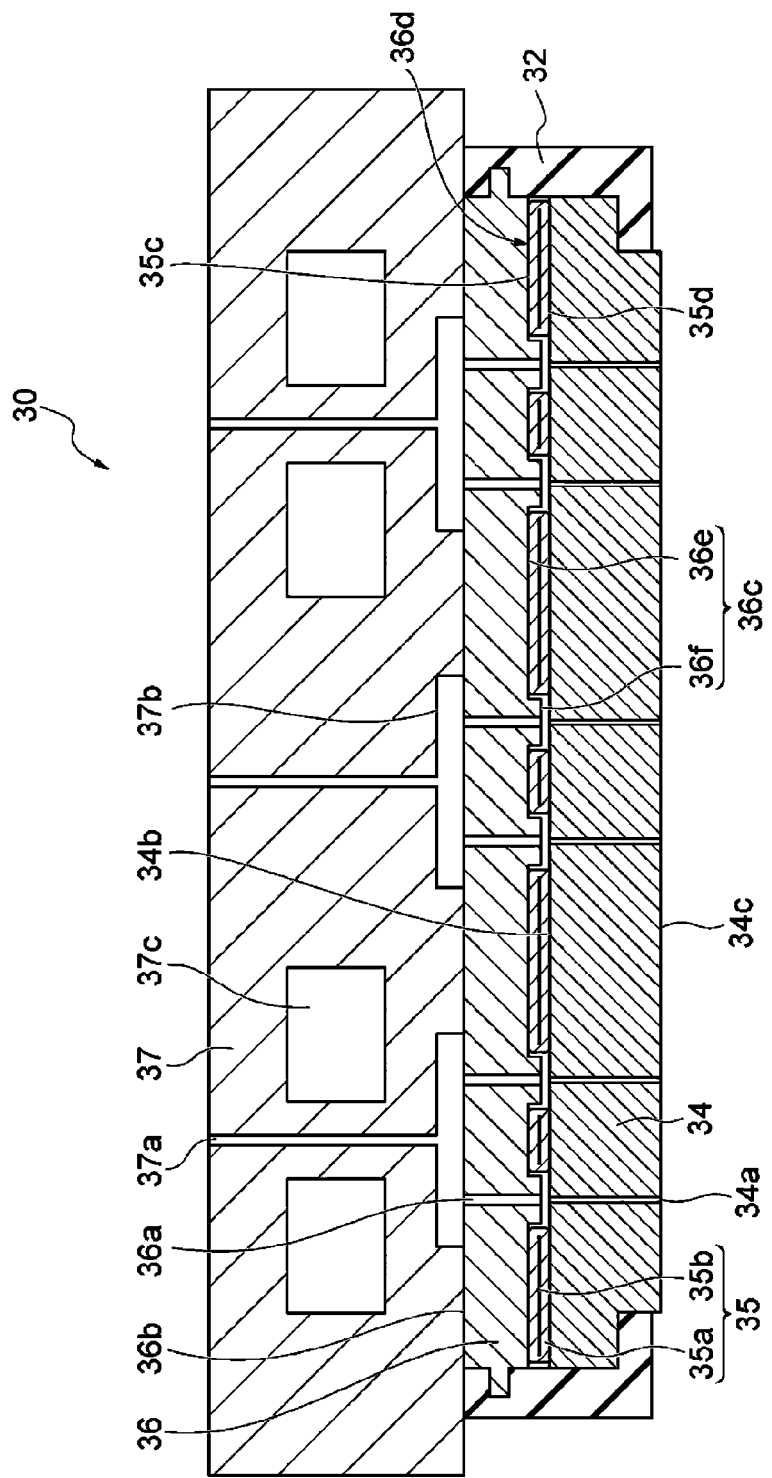
FIG. 2 is a sectional view of an upper electrode according to an embodiment.

FIG. 2 is a sectional view of the upper electrode according to an embodiment. As illustrated in FIG. 2, the upper electrode 30 has a structure in which the electrode 34, the gas plate 36, and the cooling plate 37 are superposed in this order from below.

The electrostatic chuck 35 is interposed between the electrode 34 and the gas plate 36. An upper surface of the electrostatic chuck 35 is a contact surface 35c in contact with a lower surface 36c of the gas plate 36, and is fixed to the lower surface 36c of the gas plate 36 by, for example, an adhesive. A lower surface of the electrostatic chuck 35 is an attraction surface 35d that attracts an upper surface 34b of the electrode 34.

The lower surface 36c of the gas plate 36 may have a first region 36e facing the contact surface 35c of the electrostatic chuck 35, and a second region 36f facing the gas discharge holes 34a. The second region 36f protrudes downward relative to the first region 36e so as to form an accommodation part 36d. The electrostatic chuck 35 is disposed in the accommodation part 36d.

The electrostatic chuck 35 has a main body 35a formed of a dielectric. The main body 35a has elasticity properties. An electrode 35b is provided inside the main body 35a. The electrode 35b is connected to a direct current power supply. The connection to the power supply will be described below. When a voltage from the direct current power supply is applied to the electrode 35b of the electrostatic chuck 35, an electrostatic attractive force is generated between the electrostatic chuck 35 and the electrode 34. The electrode 34 is drawn to the electrostatic chuck 35 by the generated electrostatic attractive force, and is held by the electrostatic chuck 35. Further, the upper electrode 30 illustrated in FIG. 2 is in a state in which no voltage is applied to the electrostatic chuck 35. A thickness of the electrostatic chuck 35 before applying the voltage is thicker than a protrusion length of the second region 36f with respect to the first region 36e.

Figure 3:
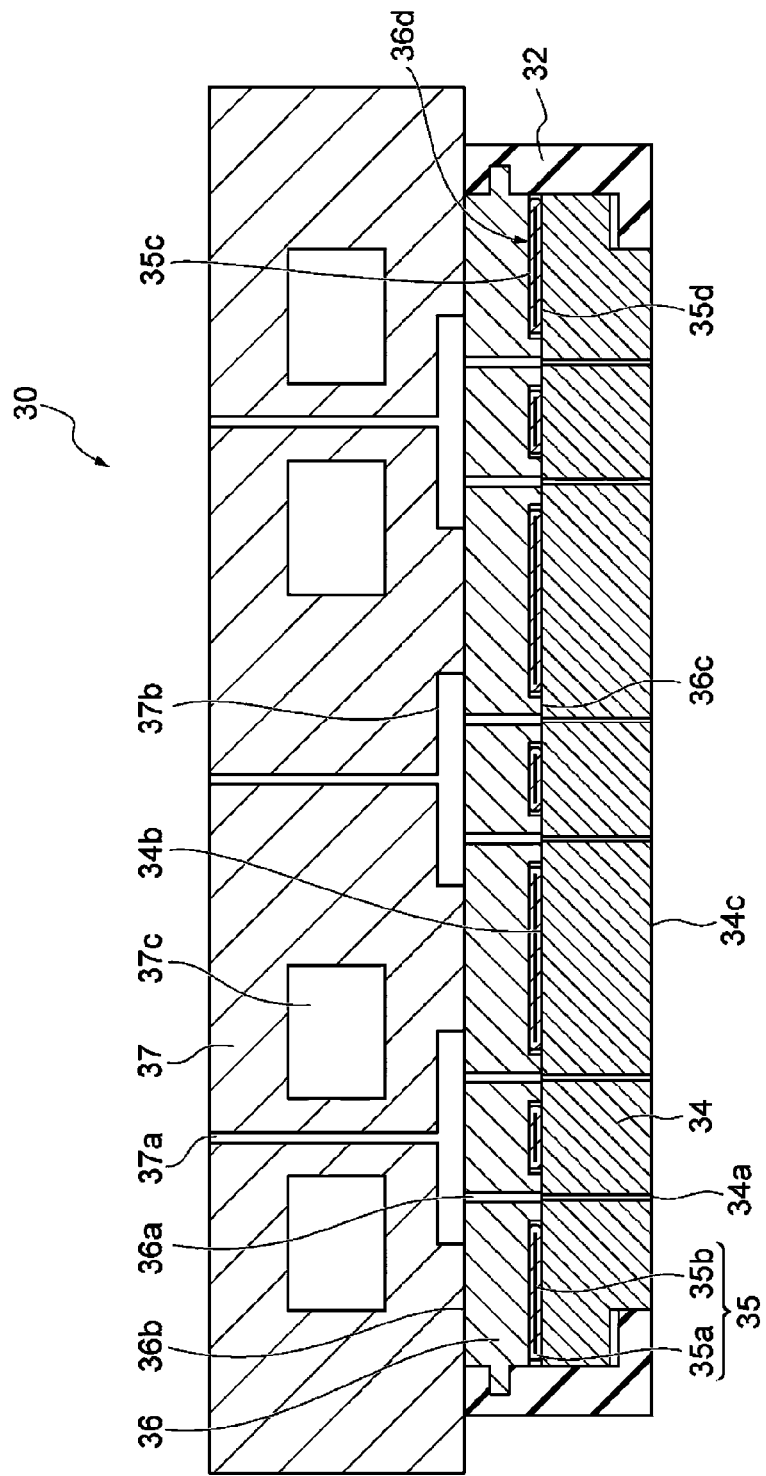
FIG. 3 is a sectional view of the upper electrode according to an embodiment.

FIG. 3 is a sectional view of the upper electrode according to an embodiment. FIG. 3 is a view illustrating a state in which a voltage is applied to the electrostatic chuck 35 illustrated in FIG. 2. As illustrated in FIG. 3, when a voltage is applied to the electrostatic chuck 35, the electrode 34 is drawn to the gas plate 36 by the electrostatic chuck 35. At this time, the electrostatic chuck 35 is inserted between the electrode 34 and the gas plate 36 and pressed by the electrode 34 and the gas plate 36. Since the main body 35a of the electrostatic chuck 35 has elasticity properties, the electrostatic chuck 35 is press-fit in the accommodation part 36d. Then, the upper surface 34b of the electrode 34 and the lower surface 36c of the gas plate 36 are brought into contact with each other, and the upward movement of the electrode 34 is stopped. As described above, by an action of the electrostatic chuck 35, the electrostatic chuck 35 is disposed between the electrode 34 and the gas plate 36 in a state in which the main body 35a of the electrostatic chuck 35 is compressed. The thickness of the electrostatic chuck 35 after applying the voltage is the same as the protrusion length of the second region 36f with respect to the first region 36e. Thus, the upper surface 34b of the electrode 34 is brought into close contact with the lower surface 36c of the gas plate 36.

Figure 4:
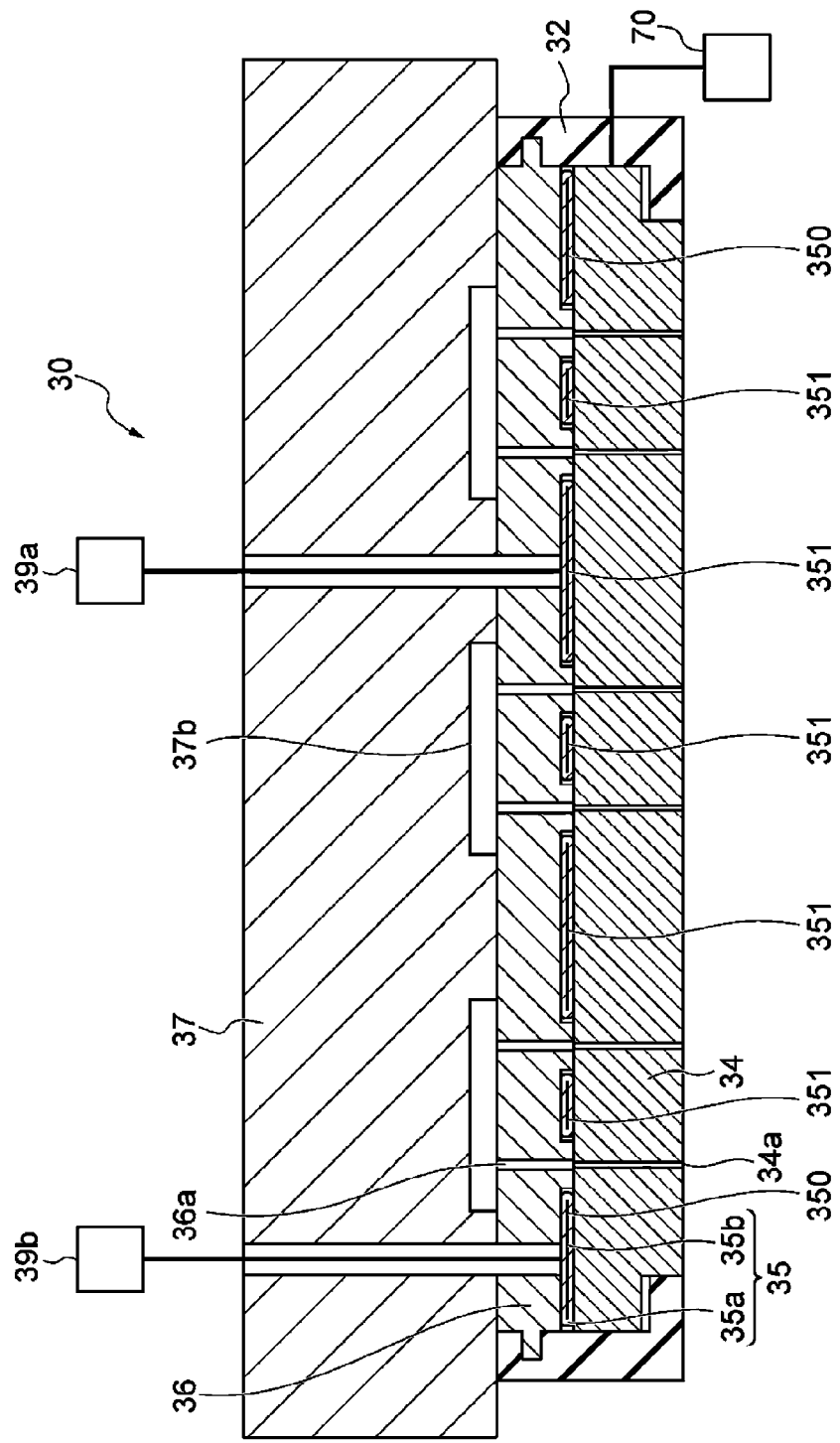
FIG. 4 is a sectional view of the upper electrode according to an embodiment.
Figure 5:
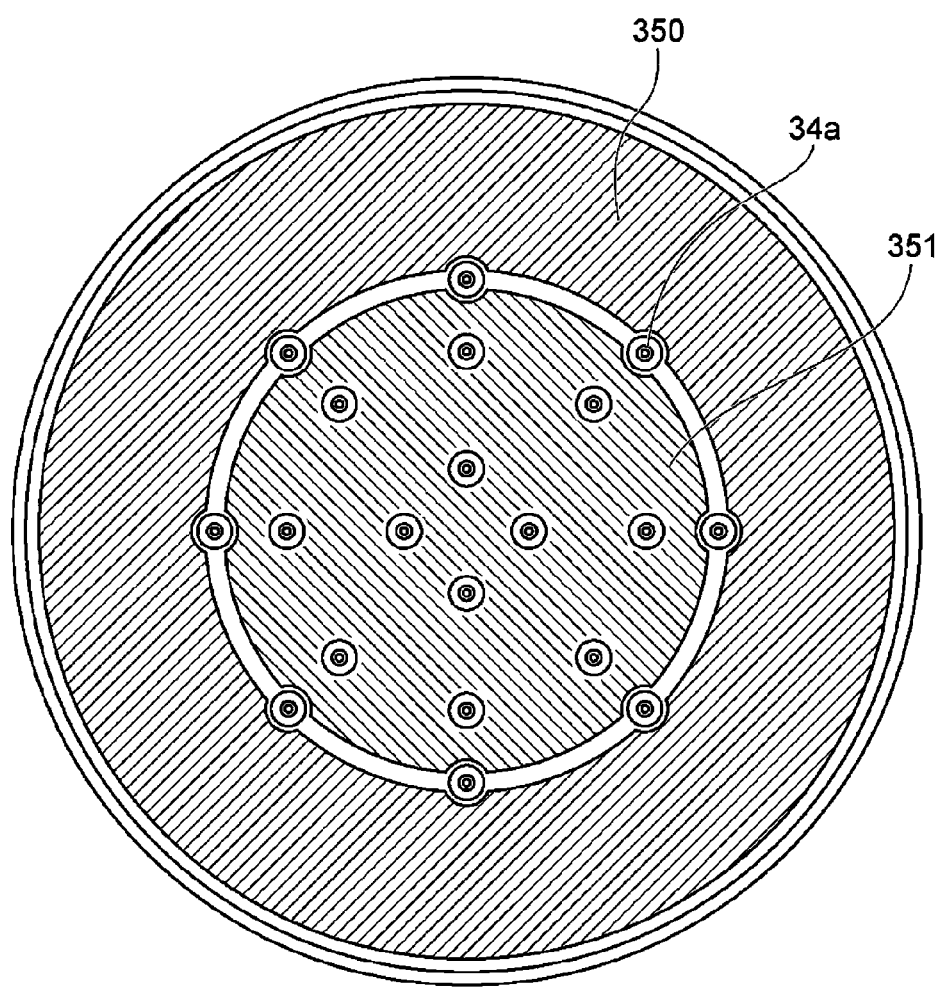
FIG. 5 is a view schematically illustrating an example of a layout of a first electrode and a second electrode.

FIG. 4 is a sectional view of the upper electrode according to an embodiment. As illustrated in FIG. 4, a first direct current power supply 39a and a second direct current power supply 39b are connected to the electrostatic chuck 35. Although the two direct current power supplies are illustrated in FIG. 4, the number of direct current power supplies is not limited thereto. The number of direct current power supplies may correspond to the number of electrodes to be controlled by the electrostatic chuck 35. That is, in the example of FIG. 4, the electrostatic chuck 35 includes a first electrode 351 and a second electrode 350. FIG. 5 is a view schematically illustrating an example of a layout of the first and second electrodes. As illustrated in FIGS. 4 and 5, the first electrode 351 is disposed at a central portion of the electrostatic chuck 35, and the second electrode 350 surrounds a circumference of the first electrode 35. The first electrode 351 and the second electrode 350 have cut-out portions in the vicinity of the gas discharge holes 34a. The first electrode 351 and the second electrode 350 may have separate main bodies, i.e., a first main body and a second main body, respectively, or may have a single integrated main body. Hereinafter, for convenience, a configuration of the electrostatic chuck 35 relevant to the first electrode 351 is referred to as a first attractor, and a configuration of the electrostatic chuck 35 relevant to the second electrode 350 is referred to as a second attractor.

Voltages having polarities different from each other may be applied to the first electrode 351 and the second electrode 350. In this case, the electrostatic chuck 35 attracts the electrode 34 in a bipolar manner Voltages having the same polarity may be applied to the first electrode 351 and the second electrode 350. In this case, the electrostatic chuck 35 attracts the electrode 34 in a unipolar manner Details of the voltage applying process will be described below.

[Details of Shield]

Figure 6:
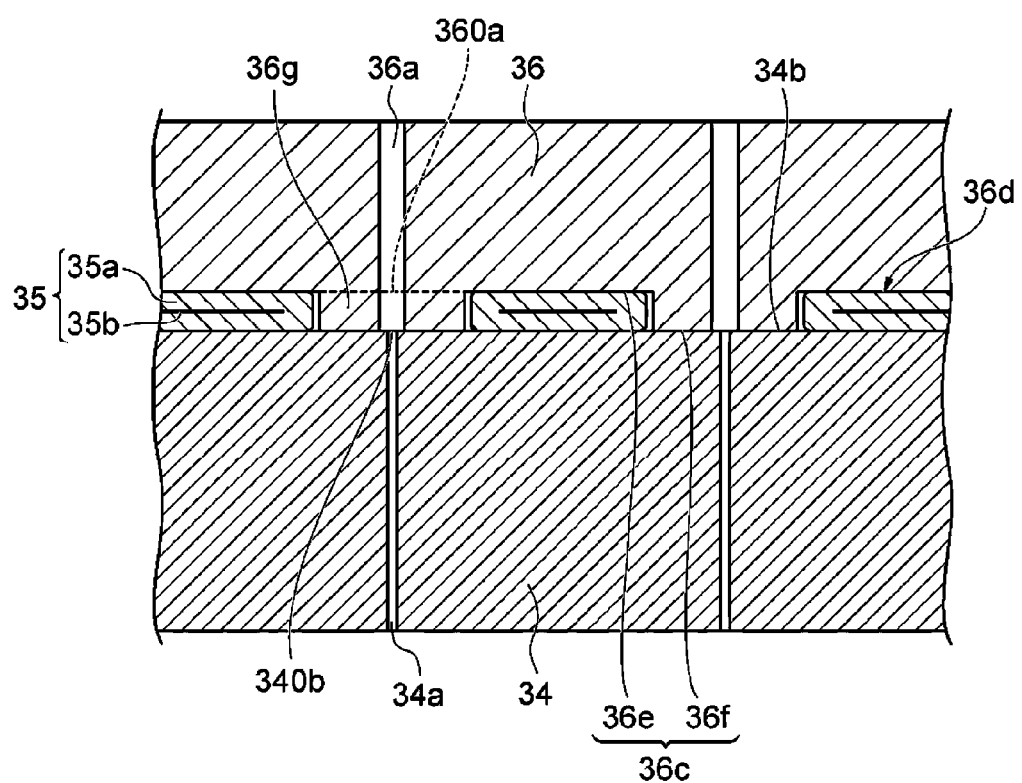
FIG. 6 is a partially enlarged view illustrating an example of a shield.

The upper electrode 30 has a shield. The shield shields radicals or gases moving from the gas discharge holes 34a to a space between the electrode 34 and the gas plate 36. FIG. 6 is a partially enlarged view illustrating an example of the shield. FIG. 6 is a partially enlarged view of FIG. 3. The shield illustrated in FIG. 6 is configured by protrusions 36g (an example of the connector) formed in the lower surface 36c of the gas plate 36. That is, in the example of FIG. 6, the gas plate 36 has a shield structure. The protrusions 36g surround vicinities of lower ends 360a of the gas flow passages 36a. Thus, the lower ends 360a of the gas flow passages 36a and upper ends 340b of the gas discharge holes 34a are connected by internal flow passages of the protrusions 36g. Since the protrusions 36g are brought into close contact with the upper surface 34b of the electrode 34, the protrusions 36g can physically shield the radicals or gases moving from the gas discharge holes 34a to the space between the electrode 34 and the gas plate 36.

Figure 7:
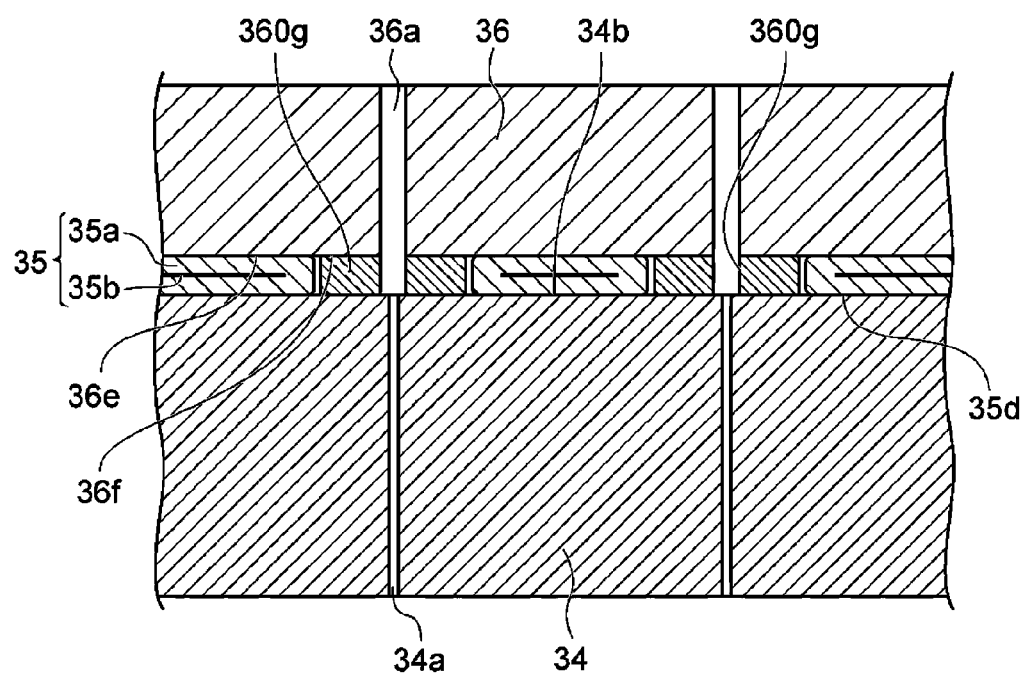
FIG. 7 is a partially enlarged view illustrating another example of the shield.

The shield is not limited to the example illustrated in FIG. 6, and can be implemented in various forms. FIG. 7 is a partially enlarged view illustrating another example of the shield. As illustrated in FIG. 7, the shield has connectors 360g (an example of the connector) interposed between the electrode 34 and the gas plate 36 and connecting the upper ends of the gas discharge holes 34a and the lower ends of the gas flow passages 36a. The connectors 360g correspond to the protrusions 36g illustrated in FIG. 6, but are formed separately from the gas plate 36 and the electrode 34. The connectors 360g have upper ends connected to the second region 36f in the lower surface of the gas plate 36, and lower ends connected to the upper surface 34b of the electrode 34. The internal flow passages, via which the gas discharge holes 34a and the gas flow passages 36a communicate with each other, are defined in the connectors 360g. Since the connectors 360g are brought into close contact with the second region 36f in the lower surface of the gas plate 36 and the upper surface 34b of the electrode 34, the connectors 360g can physically shield the radicals or gases moving from the gas discharge holes 34a to the space between the electrode 34 and the gas plate 36.

Figure 8:
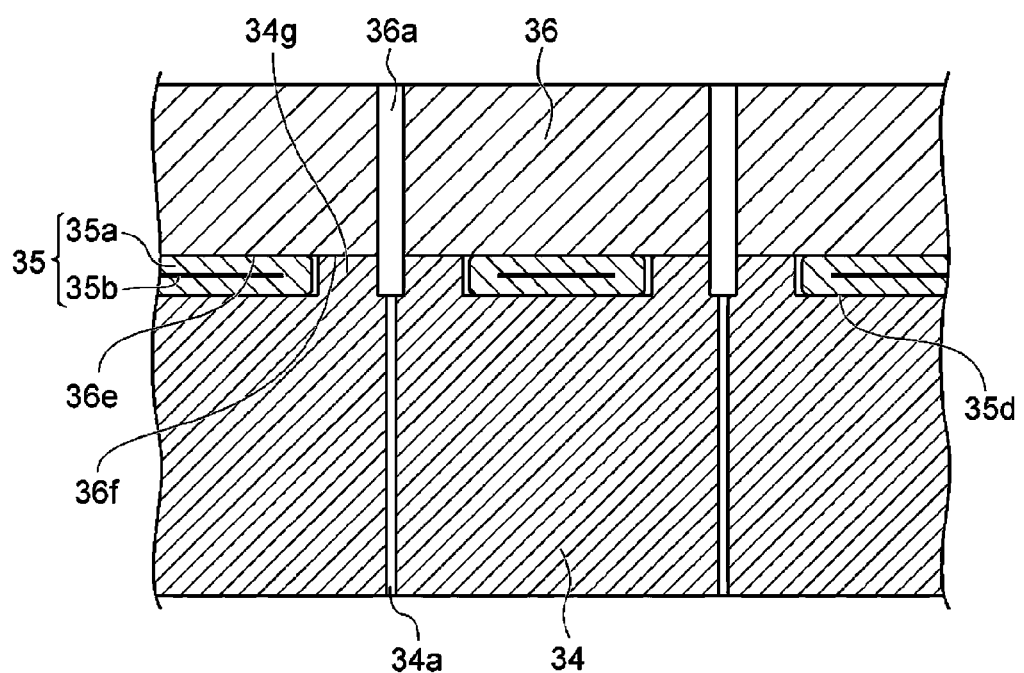
FIG. 8 is a partially enlarged view illustrating another example of the shield.

FIG. 8 is a partially enlarged view illustrating another example of the shield. As illustrated in FIG. 8, the shield is configured by protrusions 34g (an example of the connector) formed in the upper surface of the electrode 34, and the protrusions 34g correspond to the protrusions 36g illustrated in FIG. 6. That is, in the example of FIG. 8, the electrode 34 has a shield. Since the protrusions 34g of the electrode 34 are brought into close contact with the second region 36f in the lower surface of the gas plate 36, the protrusions 34g can physically shield the radicals or gases moving from the gas discharge holes 34a to the space between the electrode 34 and the gas plate 36. Alternatively, the connector may be configured by a combination of the protrusions 34g and the protrusions 36g. That is, the connector may be configured by a combination of an upper connector corresponding to the protrusions 36g and a lower connector corresponding to the protrusion 34g.

Figure 9:
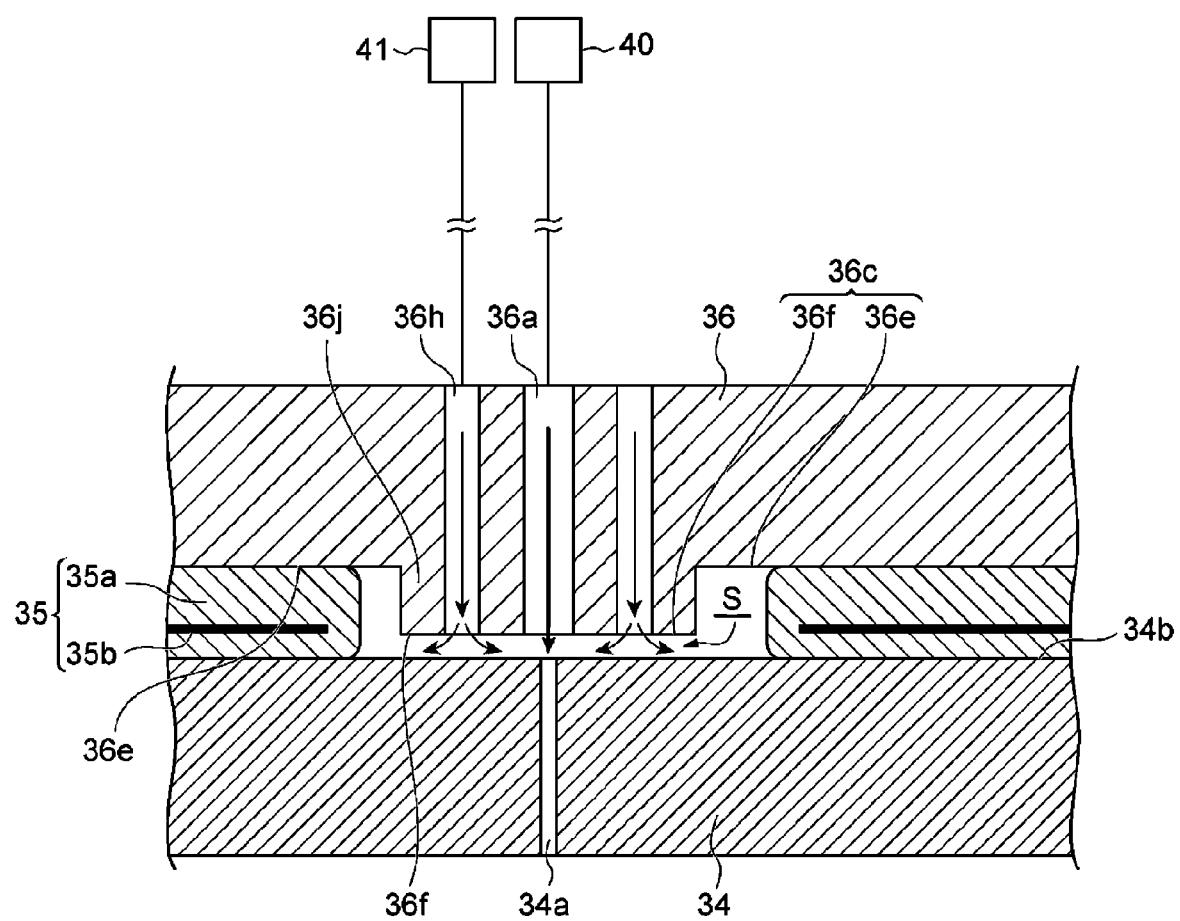
FIG. 9 is a partially enlarged view illustrating another example of the shield.

FIG. 9 is a partially enlarged view illustrating another example of the shield. As illustrated in FIG. 9, the shield has a gas source group 41 (an example of the gas source), and supply flow passages 36h connected to the gas source group 41. The gas source group 41 has similar configuration to that of the gas source group 40, and may include a plurality of gas sources. At least one of the plurality of gas sources supplies a shielding gas to the supply flow passages 36h. The supply flow passages 36h are formed in the gas plate 36, and may surround circumferences of the gas flow passages 36a in the gas plate 36. The lower surface 36c of the gas plate 36, which corresponds to the lower ends of the gas flow passages 36a and lower ends of the supply flow passages 36h, protrudes downward to form protrusions 36j. Lower end surfaces of the protrusions 36j forms the second region 36f in the gas plate 36. The lower ends of the supply flow passages 36h are located in the second region 36f in the lower surface 36c of the gas plate 36. A gap is formed between the second region 36f and the upper surface 34b of the electrode 34 so as to form a space S. The supply flow passages 36h supply the shielding gas to the space S, and thus the radicals or gases moving to the space between the electrode 34 and the gas plate 36 are shielded. Components of the shielding gas may be the same as those of the processing gas supplied by the gas source group 40. An example of the shielding gas is an argon gas.

Further, in the shield illustrated in FIG. 9, the protrusions 36j may not be present. Further, in a case where the electrode 34 and the gas plate 36 are in contact with each other, a temperature of contact portions at the time of plasma generation may be set to be 500 degrees C. or higher. In this case, there is a concern that the contact portions of the electrode 34 and the gas plate 36 are altered. In the shield illustrated in FIG. 9, the electrode 34 and the gas plate 36 are not in contact with each other. Thus, alteration caused by the contact of the electrode 34 and the gas plate 36 can be prevented. Further, it is possible to suppress particles from being generated by friction or abrasion due to a difference in thermal expansion between the electrode 34 and the gas plate 36.

Figure 10:
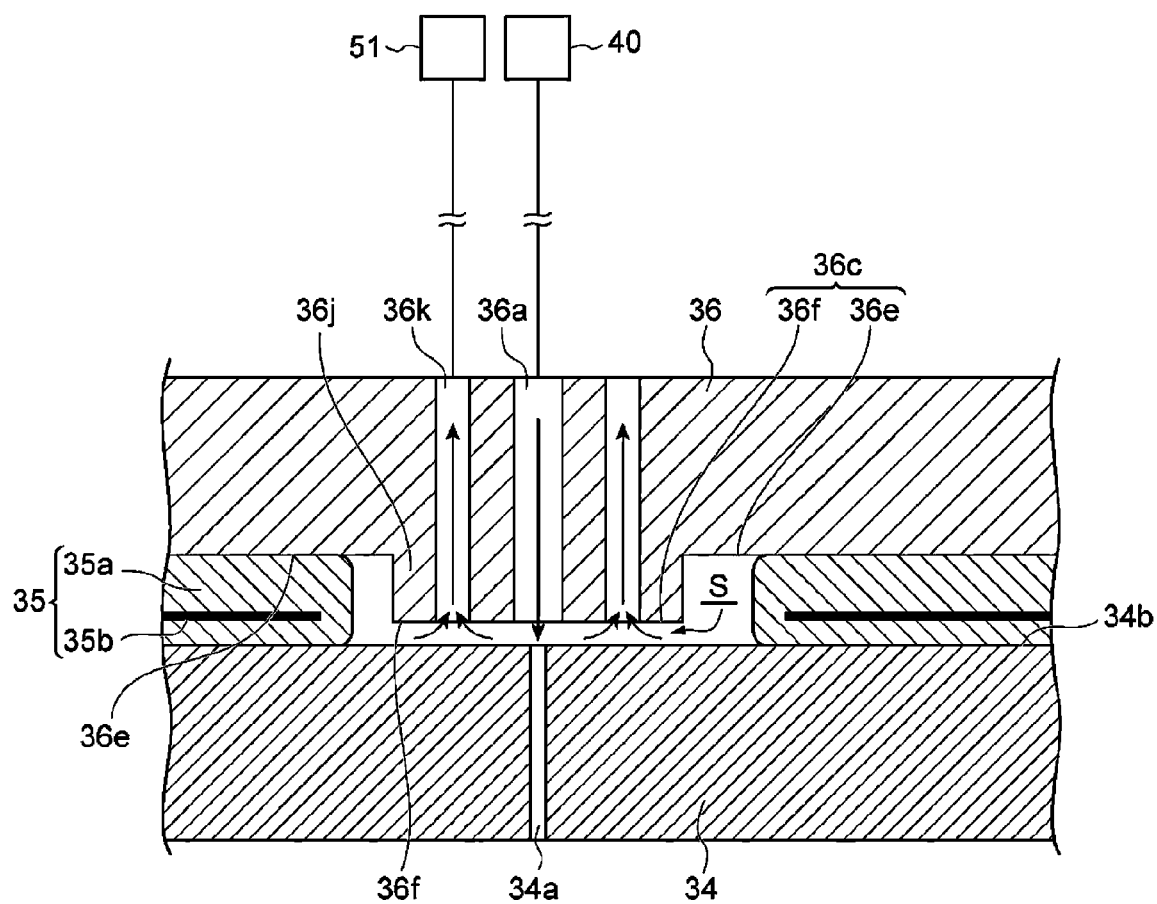
FIG. 10 is a partially enlarged view illustrating another example of the shield.

FIG. 10 is a partially enlarged view illustrating another example of the shield. As illustrated in FIG. 10, the shield has an exhaust device 51, and exhaust flow passages 36k connected to the exhaust device 51. The exhaust device 51 may be a depressurizing device such as a vacuum pump. The exhaust flow passages 36k are formed in the gas plate 36, and for example, surround circumferences of the gas flow passages 36a in the gas plate 36. The lower surface 36c of the gas plate 36, which corresponds to lower ends of the gas flow passages 36a and lower ends of the exhaust flow passages 36k, protrudes downward to form protrusions 36j. A lower end surface of the protrusion 36j forms the second region 36f in the gas plate 36. The lower ends of the exhaust flow passages 36k are located in the second region 36f in the lower surface 36c of the gas plate 36. A gap is formed between the second region 36f and the upper surface 34b of the electrode 34 so as to form a space S. The exhaust device 51 depressurizes the space S through the exhaust flow passages 36k, and thus the radicals or gases moving to the space between the electrode 34 and the gas plate 36 are shielded.

Further, in the shield illustrated in FIG. 10, the protrusions 36j may not be present. Similar to the shield illustrated in FIG. 9, in the shield illustrated in FIG. 10, the electrode 34 and the gas plate 36 are not in contact with each other. Thus, alteration caused by the contact of the electrode 34 and the gas plate 36 can be prevented. Further, it is possible to suppress particles from being generated by friction or abrasion due to a difference in thermal expansion between the electrode 34 and the gas plate 36.

Figure 11:
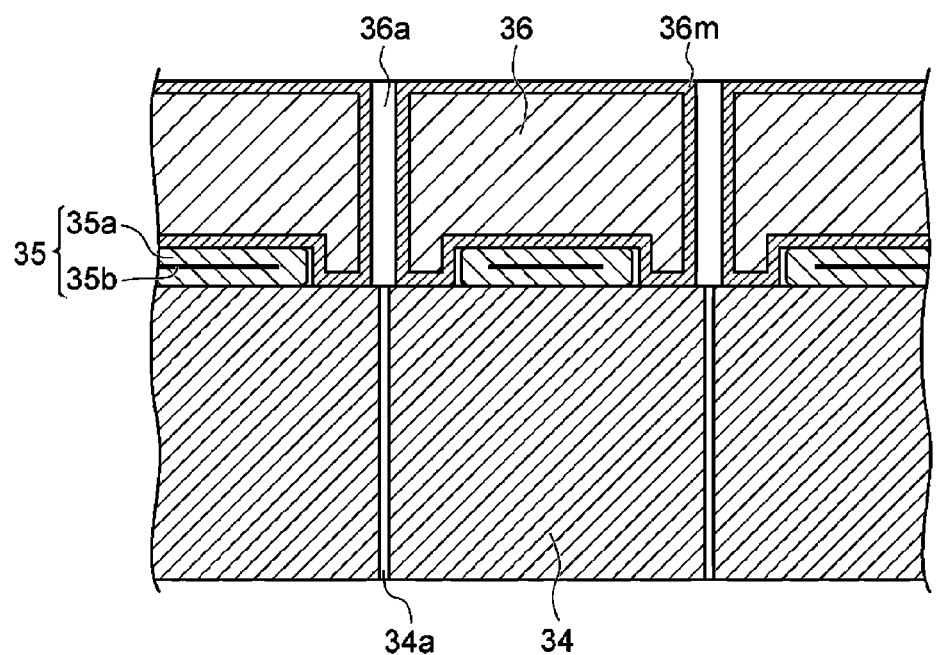
FIG. 11 is a partially enlarged view illustrating another example of the shield.

FIG. 11 is a partially enlarged view illustrating another example of the shield. A treatment for preventing alteration may be performed in advance on contact interfaces between the electrode 34 and the gas plate 36. For example, as illustrated in FIG. 11, the gas plate 36 may have passivation layers 36m at least at locations in contact with the electrode 34. Thus, alteration caused by the contact of the electrode 34 and the gas plate 36 can be prevented. For example, in a case where the gas plate 36 is formed of silicon and the electrode 34 is formed of a metal, there is a concern that silicide is formed at contact locations between the gas plate 36 and the electrode 34. The passivation layers 36m can prevent the contact locations from being altered into silicide. Further, by providing the shield with the passivation layers 36m, it is possible to suppress particles, which are difficult to remove through a cleaning process, from being generated. An example of the particles is aluminum fluoride.

[Assembling Method]

Figure 12:
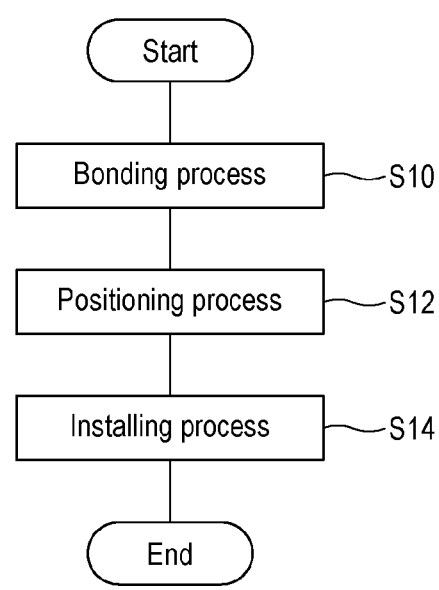
FIG. 12 is a flowchart schematically illustrating a method according to an embodiment.

FIG. 12 is a view schematically illustrating a method according to an embodiment. A method illustrated in FIG. 12 is a method for assembling the upper electrode. The method includes a bonding process (step S10), a positioning process (step S12), and an installing process (step S14).

First, the bonding process (step S10) is performed. In the bonding process, the upper surface (the contact surface 35c) of the electrostatic chuck 35 is bonded to the first region 36e in the lower surface 36c of the gas plate 36. Subsequently, in the positioning process (step S12), the upper surface 34b of the electrode 34 and the lower surface 36c of the gas plate 36 are positioned with each other to satisfy the following condition.

The condition includes locating a connector thinner than the electrostatic chuck 35 at a location between the upper surface 34b of the electrode 34 and the second region 36f in the lower surface 36c of the gas plate 36. The connector may be, for example, the protrusions 36g of FIG. 6, the connectors 360g of FIG. 7, or the protrusions 34g of FIG. 8. The condition includes allowing the gas discharge holes 34a formed in the electrode 34 and the gas flow passages 36a to face each other. For example, the gas discharge holes 34a and the gas flow passages 36a are coaxially disposed. The condition includes allowing the upper surface 34b of the electrode 34 to be in contact with the lower surface (the attraction surface 35d) of the electrostatic chuck 35.

Subsequently, in the installing process (step S14), the member 32 supporting the positioned electrode 34 is installed at the gas plate 36. The upper electrode 30 is completed as described above. When the electrode 34 is attracted and pressed against the gas plate 36 by the electrostatic chuck 35, the electrostatic chuck 35 is compressed between the upper surface 34b of the electrode 34 and the lower surface 36c of the gas plate 36. Thus, since the upper surface 34b of the electrode 34 is brought into contact with the connector, positioning in a height direction (a thickness direction) can be performed. Therefore, it is possible to improve accuracy in installation height, and as a result, it is possible to suppress accuracy of temperature adjustment of the electrode 34 from being reduced.

[Method for Controlling Electrostatic Chuck]

Figure 13:
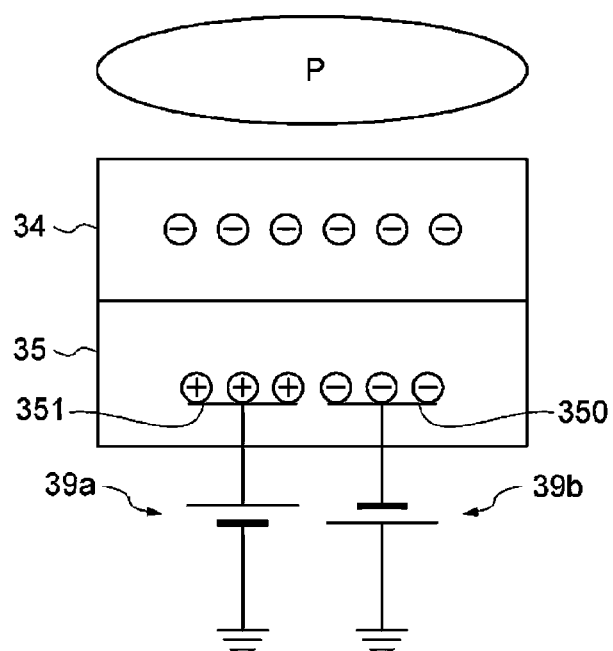
FIG. 13 is a view illustrating an example of attraction in a bipolar manner.

As illustrated in FIGS. 4 and 5, the electrostatic chuck 35 may have the first electrode 351 and the second electrode 350. The first direct current power supply 39a and the second direct current power supply 39b apply voltages having controlled polarities to the first electrode 351 and the second electrode 350, respectively. FIG. 13 is a view illustrating an example of attraction in a bipolar manner. As illustrated in FIG. 13, the first direct current power supply 39a of the electrostatic chuck 35 applies a positive voltage to the first electrode 351. The first electrode 351 is positively charged. The second direct current power supply 39b of the electrostatic chuck 35 applies a negative voltage to the second electrode 350. The second electrode 350 is negatively charged. In a case where plasma P is not formed, a part of the electrode 34 facing the first electrode 351 is negatively charged, and a part of the electrode 34 facing the second electrode 350 is positively charged. Thus, the electrode 34 is held by an electrostatic attractive force. In a case where plasma P is formed, a negative self-bias is generated at the electrode 34, and the electrode 34 is negatively charged. As described above, the bipolar manner can generate an attractive force even when the plasma P is not formed.

Figure 14:
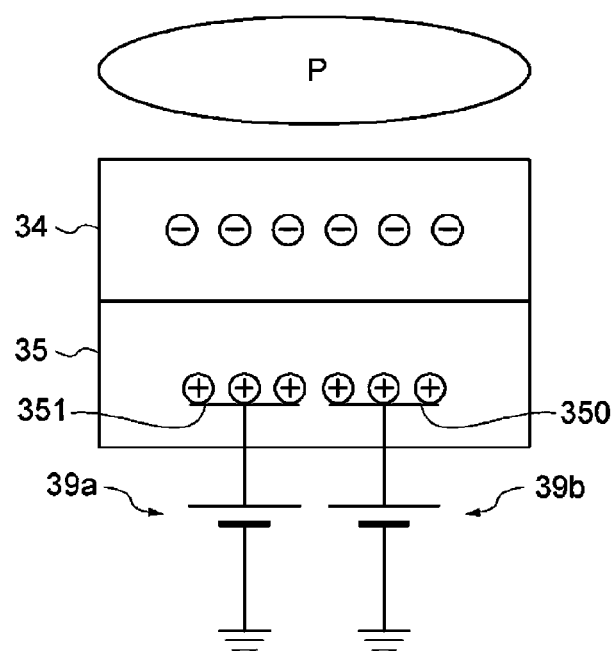
FIG. 14 is a view illustrating an example of attraction in a unipolar manner.

FIG. 14 is a view illustrating an example of attraction in a unipolar manner. As illustrated in FIG. 14, the first direct current power supply 39a of the electrostatic chuck 35 applies a positive voltage to the first electrode 351. The first electrode 351 is positively charged. Further, the second direct current power supply 39b of the electrostatic chuck 35 applies a positive voltage to the second electrode 350. The second electrode 350 is positively charged. As described above, the unipolar manner cannot generate an attractive force without an inflow of electric charges, that is, when the plasma P is not formed.

The controller Cnt may control the first direct current power supply 39a and the second direct current power supply 39b to switch the attraction manner.

Figure 15:
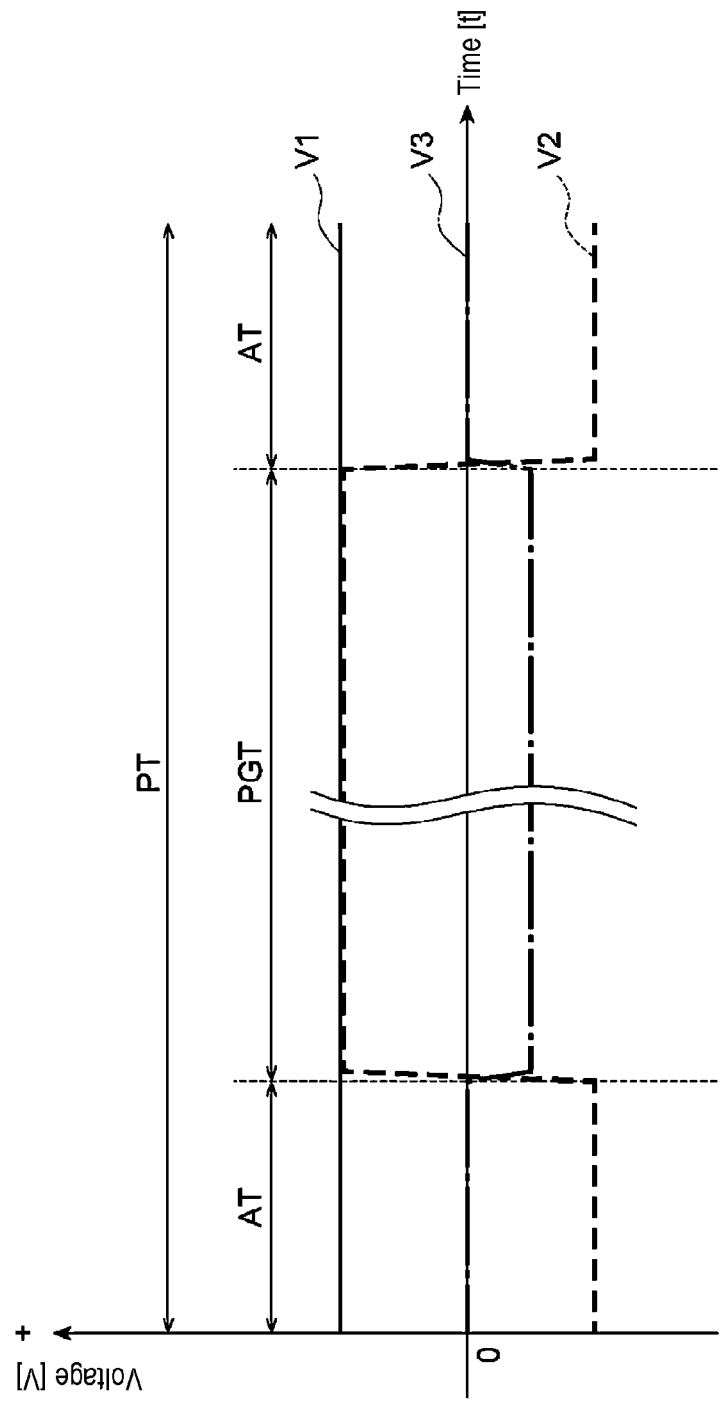
FIG. 15 is a graph illustrating an example of a relationship between voltages applied to the first electrode and the second electrode and a time.

FIG. 15 is a graph illustrating an example of a relationship between voltages applied to the first electrode and the second electrode and a time. The horizontal axis represents time, and the vertical axis represents voltage. In FIG. 15, a process period PT of the plasma processing apparatus 10 is illustrated. The process period PT includes a plasma generation period PGT and an idle period AT which are alternatingly repeated. During the plasma generation period PGT, plasma is generated by the plasma processing apparatus 10. During the idle period AT, no plasma is generated by the plasma processing apparatus 10.

The controller Cnt applies voltages having polarities different from each other to the first and second electrodes 351 and 350 of the electrostatic chuck 35 in at least the idle period AT. For example, as illustrated in FIG. 15, the controller Cnt applies a voltage represented by a voltage pattern V1 to the first electrode 351, and applies a voltage represented by a voltage pattern V2 to the second electrode 350. In the voltage pattern V1, a voltage has a positive polarity in both of the idle period AT and the plasma generation period PGT. That is, a voltage having positive polarity is always applied to the first electrode 351. Meanwhile, in the voltage pattern V2, a voltage has a negative polarity in the idle period AT, and has a positive polarity in the plasma generation period PGT. That is, a voltage having a negative polarity is applied to the second electrode 350 in the idle period AT, and a voltage having a positive polarity is applied to the second electrode 350 in the plasma generation period PGT. Further, a voltage pattern V3 illustrated in FIG. 15 represents a voltage applied to the electrode 34 by the direct current power source 70. The direct current power source 70 may continuously apply a voltage, or apply a pulse-like voltage. The direct current power source 70 may not be provided.

As described above, in the idle period AT, the controller Cnt holds the electrode 34 in the bipolar manner such that the electrode 34 is attracted to the temperature-controlled gas plate 36. Thus, since a temperature of the electrode 34 is adjusted even in the idle period AT in which no heat is input from plasma, it is possible to efficiently adjust the temperature of the electrode 34 in a subsequent plasma generation period PGT.

Further, in the plasma generation period PGT, the controller Cnt holds the electrode 34 in the unipolar manner by applying a positive voltage to both of the first electrode 351 and the second electrode 350. Thus, it is possible to hold the electrode 34 and adjust the temperature of the electrode 34 during the plasma generation without a decrease in attractive force.

Figure 16:
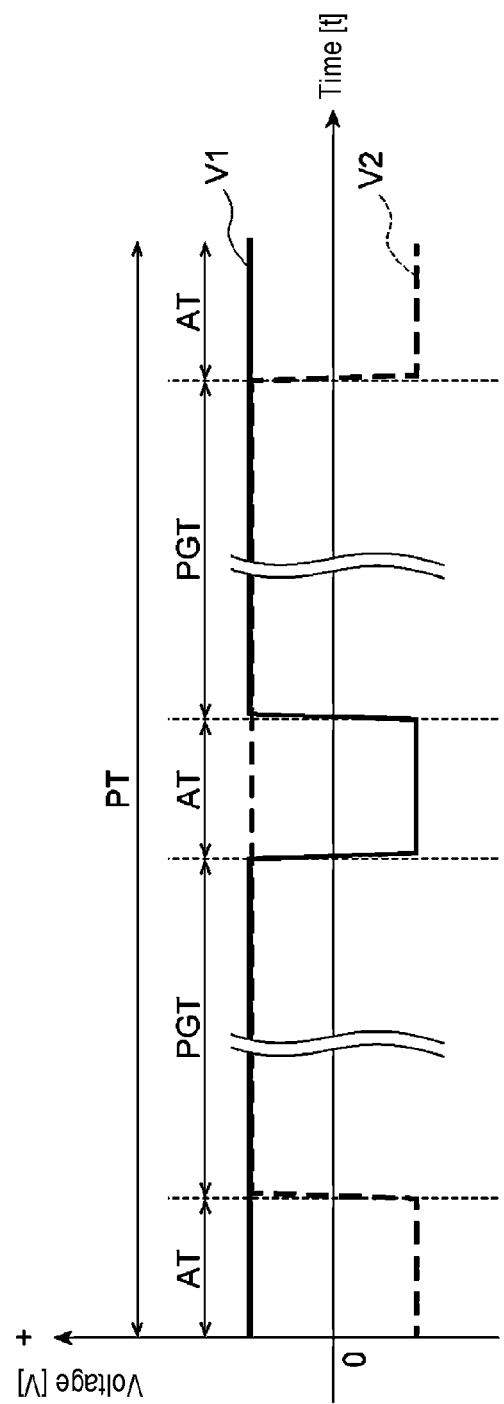
FIG. 16 is a graph illustrating an example of the relationship between voltages applied to the first electrode and the second electrode and a time.

Next, another control method by the controller Cnt will be given by way of example. FIG. 16 is a graph illustrating an example of a relationship between voltages applied to the first electrode and the second electrode and a time. The horizontal axis represents time, and the vertical axis represents voltage. In FIG. 16, a process period PT of the plasma processing apparatus 10 is illustrated. The process period PT includes a plasma generation period PGT and an idle period AT which are alternatingly repeated.

In a voltage pattern V1 illustrated in FIG. 16, a positive voltage is applied in a first idle period AT, a negative voltage is applied in a second idle period AT, and a positive voltage is applied in a third idle period AT. The voltage is always a positive voltage in the plasma generation period PGT. Meanwhile, in a voltage pattern V2, a negative voltage is applied in the first idle period AT, a positive voltage is applied in the second idle period AT, and a negative voltage is applied in the third idle period AT. The voltage is always a positive voltage in the plasma generation period PGT. As described above, the polarities of the voltages applied to the first electrode 351 and the second electrode 350 may be switched every idle period AT. By applying the voltages as described above, the polarities of the first and second electrodes 351 and 350 are not fixed to one of a positive polarity and a negative polarity. Thus, it is possible to prevent electric charges from moving in one direction (migration). Therefore, a decrease in attractive force can be avoided.

Figure 17:
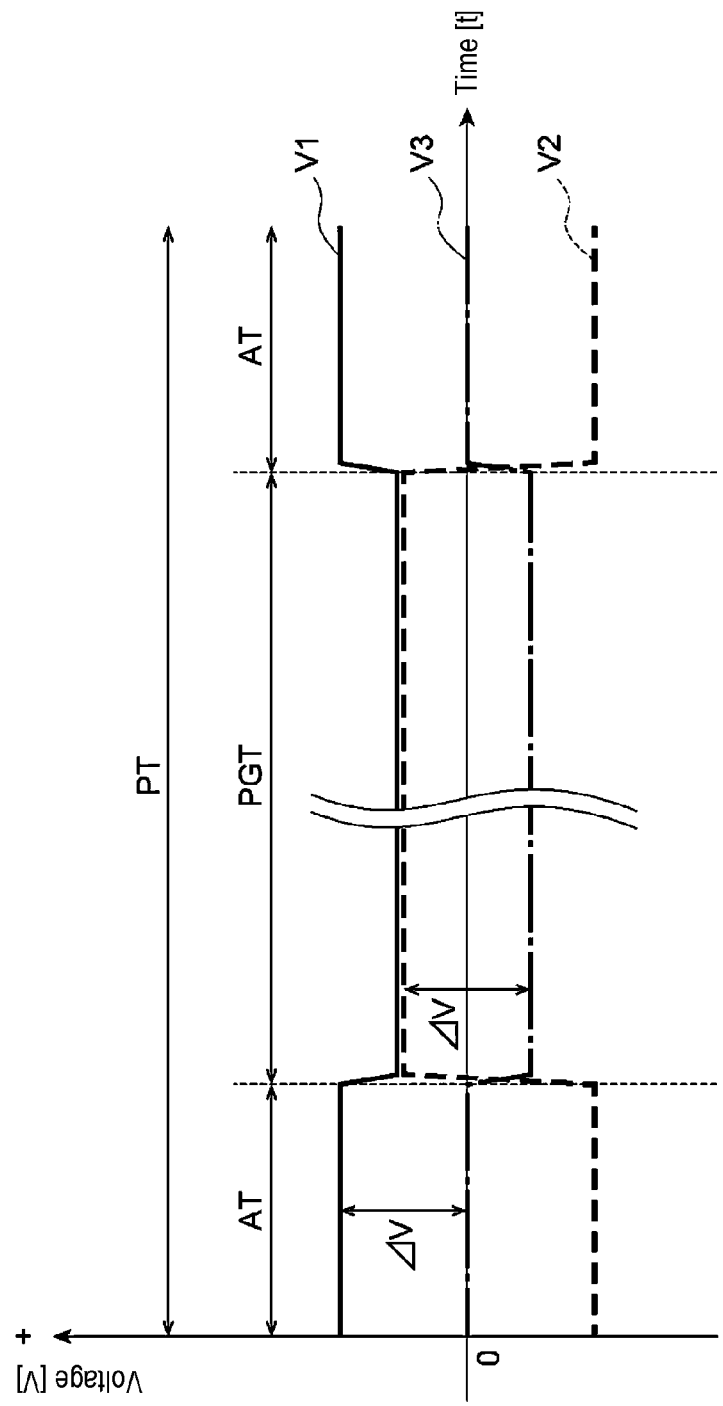
FIG. 17 is a graph illustrating an example of the relationship between voltages applied to the first electrode and the second electrode and a time.

FIG. 17 is a graph illustrating an example of a relationship between voltages applied to the first electrode and the second electrode and a time. The horizontal axis represents time, and the vertical axis represents voltage. In FIG. 17, a process period PT of the plasma processing apparatus 10 is illustrated. The process period PT includes a plasma generation period PGT and an idle period AT which are alternatingly repeated. The controller Cnt applies a voltage represented by a voltage pattern V1 to the first electrode 351, and applies a voltage represented by a voltage pattern V2 to the second electrode 350. In the voltage pattern V1 illustrated in FIG. 17, a positive voltage is applied in the entire process period PT, which is the same as in the voltage pattern V1 illustrated in FIG. 15, but a magnitude of the voltage in the plasma generation period PGT is different from that in the voltage pattern V1 illustrated in FIG. 15. To be specific, the voltage pattern V1 may be changed such that an effective difference ΔV between the positive voltage applied to the first electrode 351 and the voltage applied to the electrode 34 in the idle period AT is kept constant throughout the process period PT. Likewise, in the voltage pattern V2 illustrated in FIG. 17, a voltage has the same polarities as those in the voltage pattern V2 illustrated in FIG. 15, but a magnitude of the voltage in the plasma generation period PGT is different from that in the voltage pattern V2 illustrated in FIG. 15. To be specific, the voltage pattern V2 is changed such that an effective differential ΔV between the positive voltage having the positive polarity and applied to the first electrode 351 and the voltage applied to the electrode 34 in the idle period AT is kept constant throughout the process period PT. FIG. 17 illustrates a case where a negative self-bias generated at the electrode 34 is smaller than a voltage represented by a voltage pattern V3. In a case where the negative self-bias generated at the electrode 34 is greater than the voltage represented by the voltage pattern V3, the effective difference ΔV is calculated based on the negative self-bias to change the voltage patterns V1 and V2.

Figure 18:
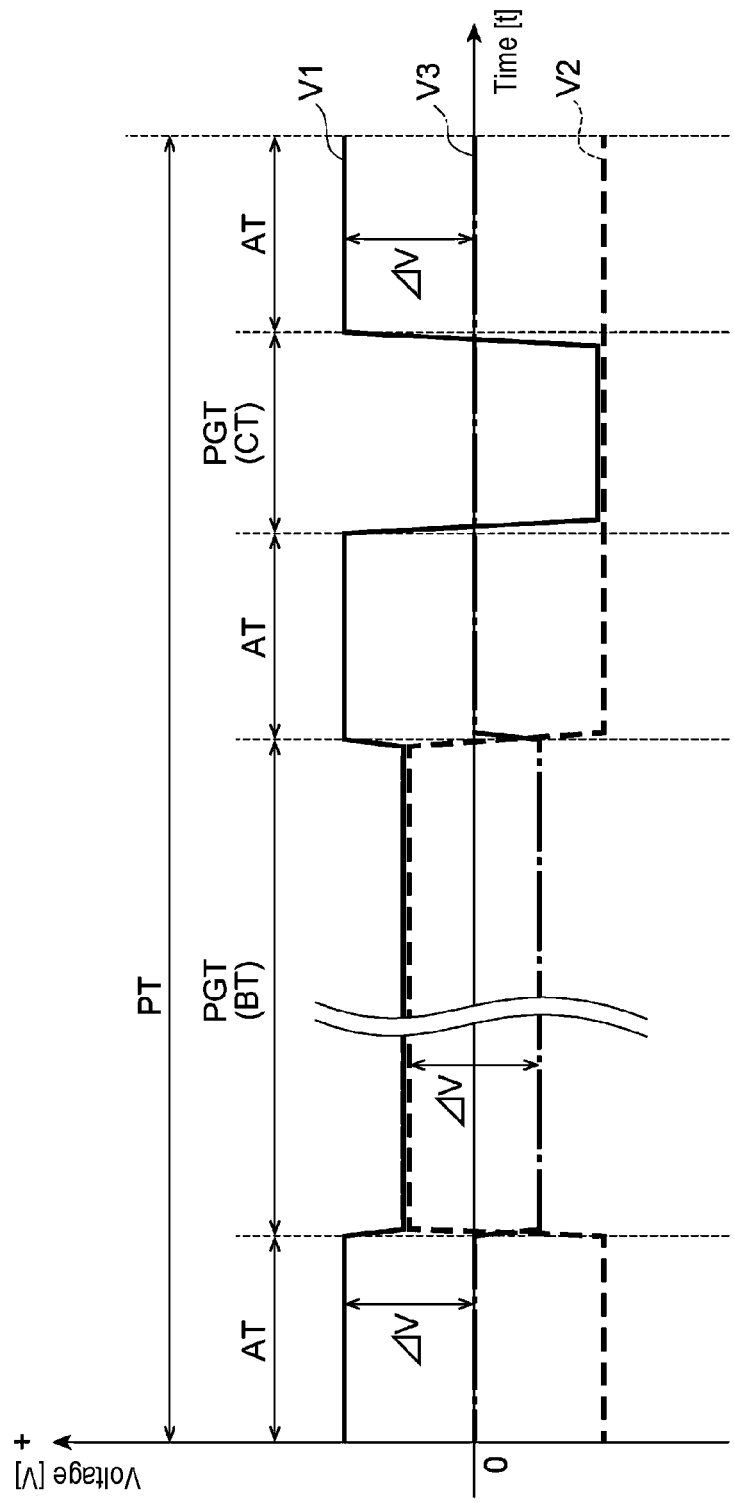
FIG. 18 is a graph illustrating an example of the relationship between voltages applied to the first electrode and the second electrode and a time.

FIG. 18 is a graph illustrating an example of the relationship between voltages applied to the first electrode and the second electrode and a time. The horizontal axis represents time, and the vertical axis represents voltage. In FIG. 18, a process period PT of the plasma processing apparatus 10 is illustrated. The process period PT includes a plasma generation period PGT and an idle period AT which are alternatingly repeated. The plasma generation period PGT is a substrate processing period BT in which a substrate is process with generated plasma, or a cleaning period in which a cleaning process is performed using the generated plasma. In the substrate processing period BT, an etching process, a film forming process, or the like using plasma is performed on the substrate based on the recipe date. Thus, the substrate is machined as designed. In the cleaning period, the interior of the chamber main body 12 is dry-cleaned. To be specific, particles present in the internal space 12s of the chamber main body 12 are removed using plasma. The particles may be reaction products generated in the substrate processing period BT, gas molecules used in the substrate processing period BT, or the like. The particles are not limited to substances generated in the substrate processing period BT. For example, the particles may be substances remaining in the internal space 12s of the chamber main body 12 at a start-up time of the plasma processing apparatus 10 or before a start of the substrate processing period BT. That is, any one of the substrate processing period BT and the cleaning period may appear first.

The cleaning period includes a first cleaning period CT in which plasma is generated in a state where no substrate is accommodated in the internal space 12s of the chamber main body 12, and a second cleaning period DT in which plasma is generated in a state where the substrate is accommodated in the internal space 12s of the chamber main body 12.

In the example of FIG. 18, the process period PT includes the idle period AT, the substrate processing period BT, the idle period AT, the first cleaning period CT, and the idle period AT in this order. The controller Cnt applies a voltage represented by a voltage pattern V1 to the first electrode 351, and applies a voltage represented by a voltage pattern V2 to the second electrode 350. The voltage patterns V1, V2, and V3 illustrated in FIG. 18 are the same to the voltage patterns V1, V2, and V3 illustrated in FIG. 17 until the idle period AT, the substrate processing period BT, and the idle period AT. In the example of FIG. 18, a voltage having a polarity different from that of a voltage applied to the first electrode 351 in the substrate processing period BT is applied to the first electrode 351 in the first cleaning period CT (see the voltage pattern V1). When a positive voltage is applied to the first electrode 351M the substrate processing period BT, a negative voltage is applied to the first electrode 351 in the first cleaning period CT. When a negative voltage is applied to the first electrode 351M the substrate processing period BT, a positive voltage is applied to the first electrode 351 in the first cleaning period CT. By applying the voltage as described above, a polarities of the first electrode 351 is not fixed to one of a positive polarity and a negative polarity. Thus, it is possible to prevent electric charges from moving in one direction (migration). Therefore, it is possible to avoid reduction in attractive force.

In the first cleaning period CT, a voltage having a polarity different from that of a voltage applied to the second electrode 350 in the substrate processing period BT may be applied to the second electrode 350 (see the voltage pattern V2). When a positive voltage is applied to the second electrode 350 in the substrate processing period BT, a negative voltage is applied to the second electrode 350 I in the first cleaning period CT. Alternatively, in the first cleaning period CT, a voltage having a polarity different from that of a voltage applied to the second electrode 350 in the just before idle period AT may be applied to the second electrode 350. In this case, it is possible to prevent the migration of electric charges. In the voltage pattern V3, a voltage is set to be a constant value of 0 V after a completion of the substrate processing period BT.

Figure 19:
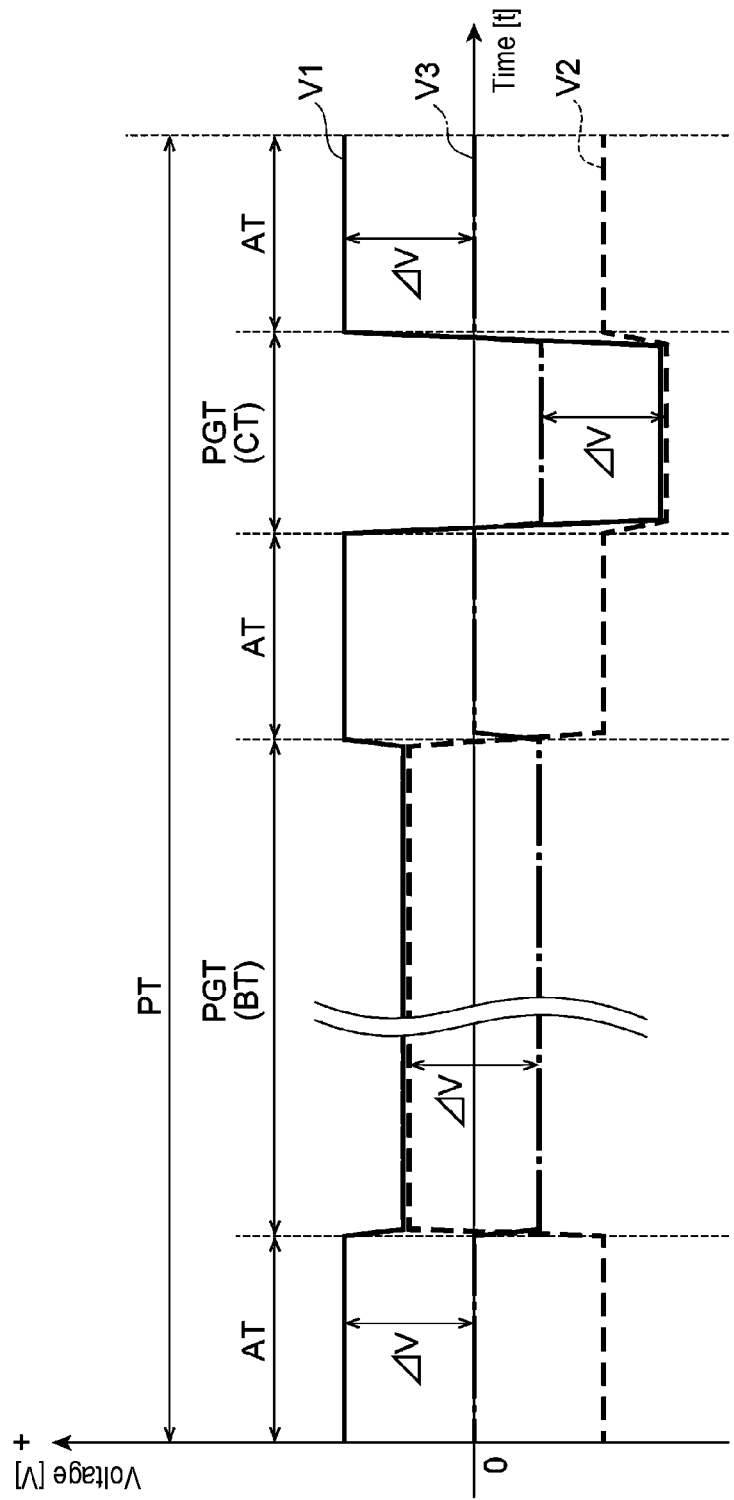
FIG. 19 is a graph illustrating an example of the relationship between voltages applied to the first electrode and the second electrode and a time.

In the first cleaning period CT, a voltage may be applied from the direct current power source 70 to the electrode 34. FIG. 19 is a graph illustrating an example of the relationship between voltages applied to the first electrode and the second electrode and a time. Voltage patterns V1, V2, and V3 illustrated in FIG. 19 are the same as the voltage patterns V1, V2, and V3 illustrated in FIG. 18 except for voltages applied in the first cleaning period CT. As illustrated in FIG. 19, in the first cleaning period CT, a negative voltage is applied from the direct current power source 70 to the electrode 34. In this case, the voltage pattern V1 is changed such that an effective difference ΔV between the positive voltage applied to the first electrode 351 and the voltage applied to the electrode 34 in the idle period AT is kept constant throughout the process period PT. Similarly, the voltage pattern V2 is changed such that an effective difference ΔV between the negative voltage applied to the second electrode 350 and the voltage applied to the electrode 34 in the idle period AT is kept constant throughout the process period PT.

Figure 20:
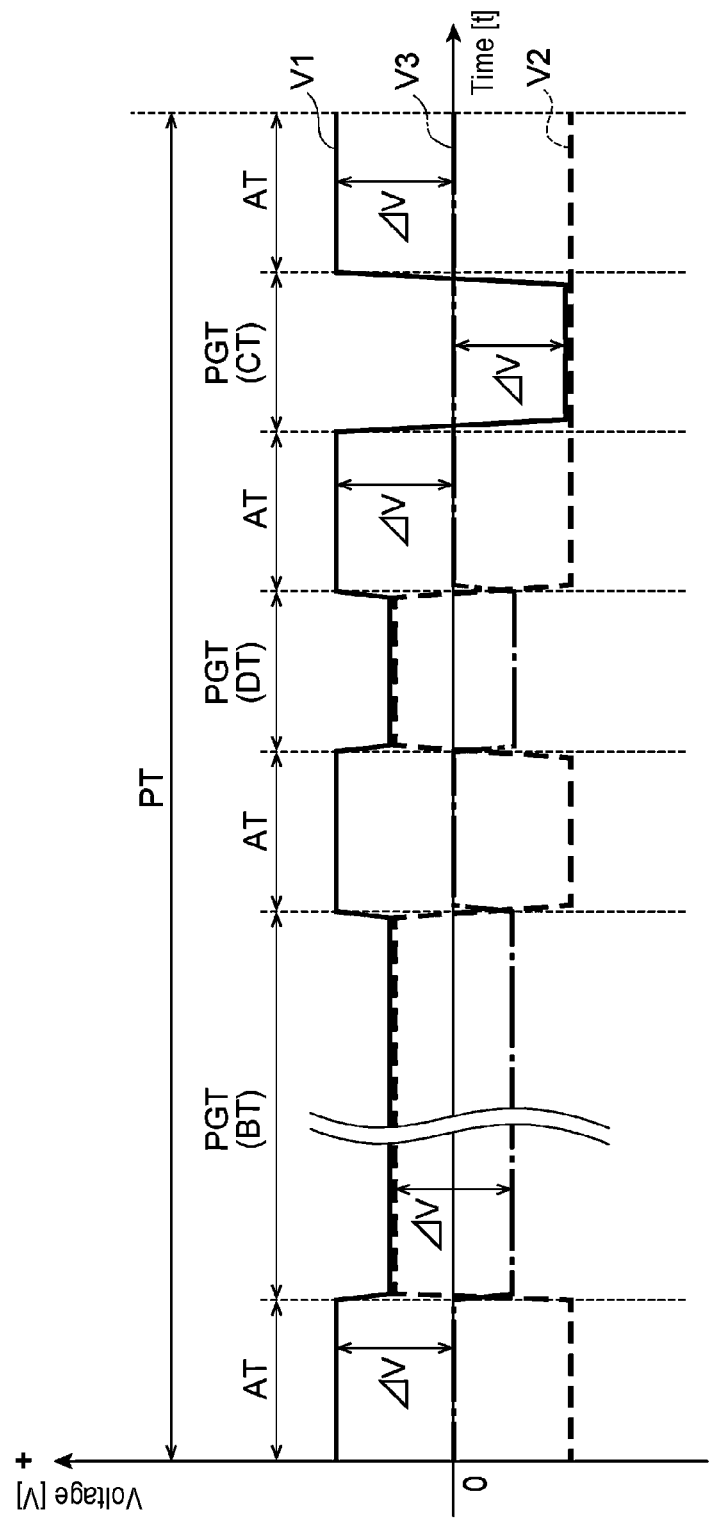
FIG. 20 is a graph illustrating an example of the relationship between voltages applied to the first electrode and the second electrode and a time.

FIG. 20 is a graph illustrating an example of the relationship between voltages applied to the first electrode and the second electrode and a time. The horizontal axis represents time, and the vertical axis represents voltage. In FIG. 20, a process period PT of the plasma processing apparatus 10 is illustrated. The process period PT includes a plasma generation period PGT and an idle period AT which are repeated alternately. In the example of FIG. 20, the process period PT includes the idle period AT, a substrate processing period BT, the idle period AT, a second cleaning period DT, the idle period AT, a first cleaning period CT, and the idle period AT in this order. In the example of FIG. 20, the second cleaning period DT is inserted in the idle period AT which appears between the substrate processing period BT and the first cleaning period CT in the graph illustrated in FIG. 18. Thus, descriptions will be made only on differences from the graph illustrated in FIG. 18.

In the second cleaning period DT, plasma is generated in a state where the substrate is accommodated in the internal space 12s of the chamber main body 12. In the second cleaning period DT, the substrate is disposed on the electrostatic chuck 20.

In the example of FIG. 20, a negative voltage is applied from the direct current power source 70 to the electrode 34. In this case, a voltage pattern V1 is changed such that an effective difference ΔV between a positive voltage applied to the first electrode 351 and the voltage applied to the electrode 34 in the idle period AT is kept constant throughout the process period PT. Similarly, a voltage pattern V2 is changed such that an effective difference ΔV between a negative voltage applied to the second electrode 350 and the voltage applied to the electrode 34 in the idle period AT is kept constant throughout the process period PT.

FIG. 21 is a graph illustrating an example of the relationship between voltages applied to the first electrode and the second electrode and a time. The horizontal axis represents time, and the vertical axis represents voltage. In FIG. 21, a process period PT of the plasma processing apparatus 10 is illustrated. The process period PT includes a plasma generation period PGT and an idle period AT which are repeated alternately. In the example of FIG. 21, the process period PT includes the idle period AT, a substrate processing period BT, the idle period AT, a second cleaning period DT, the idle period AT, a first cleaning period CT, and the idle period AT in this order. In the example of FIG. 21, the second cleaning period DT is inserted in the idle period AT which appears between the substrate processing period BT and the first cleaning period CT in the graph illustrated in FIG. 19. The second cleaning period DT is similar to that described with reference to FIG. 20.

While various embodiments have been described, the present disclosure is not limited to the above-described embodiments, and various omissions, substitutions, and modifications may be made. Further, features of the embodiments different from one another may be combined to form a new embodiment.

For example, the plasma processing apparatus 10 according to the above-described embodiments is a capacitively coupled plasma processing apparatus, but a plasma processing apparatuses according to the new embodiment may be a different type of plasma processing apparatus. Such plasma processing apparatus may be an arbitrary type of plasma processing apparatus. For example, the plasma processing apparatus may be an inductively coupled plasma processing apparatus, or a plasma processing apparatus that generates plasma by means of a surface wave such as a microwave.

Further, in the plasma processing apparatus 10 according to the above-described embodiments, a dual high frequency power supply system is connected to the lower electrode 18 and a direct current power supply is connected to the upper electrode 30, but the present disclosure is not limited thereto. For example, the plasma processing apparatus 10 may not include the upper electrode 30. For example, in the plasma processing apparatus 10, a high frequency power supply may be connected to each of the lower electrode 18 and the upper electrode 30.

According to the present disclosure, it is possible to appropriately adjust the temperature of the upper electrode.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for controlling an electrostatic chuck comprising:
    providing a substrate support in a lower portion of a plasma processing apparatus to support a substrate;
    providing the electrostatic chuck in an upper portion of the plasma processing apparatus, the electrostatic chuck being opposed to the substrate support and configured to attract an electrode to a gas plate; and
    applying voltages having polarities different from each other to first and second electrodes of the electrostatic chuck during at least an idle period among a plasma generation period in which plasma is generated by the plasma processing apparatus and the idle period in which no plasma is generated by the plasma processing apparatus.

2. The method of claim 1, wherein a process period of the plasma processing apparatus includes the plasma generation period and the idle period which are alternatingly repeated, and
    wherein the applying the voltages having polarities different from each other includes switching polarities of the voltages applied to the first and second electrodes every idle period.

3. The method of claim 1, further comprising applying a negative voltage to the electrode during the plasma generation period.

4. The method of claim 1, further comprising applying voltages having the same polarity to the first and second electrodes during the plasma generation period.

5. The method of claim 1, further comprising applying a negative voltage to the electrode and applying positive voltages to the first and second electrodes, respectively, during the plasma generation period.

6. The method of claim 4, wherein applying the voltages having the same polarity includes applying positive voltages to the first and second electrodes and applying a negative voltage to the electrode such that a difference between the positive voltages applied to the first and second electrodes and the negative voltage applied to the electrode is set to be equal to a magnitude of the voltages applied to the first and second electrodes during the idle period.

7. The method of claim 6, wherein the negative voltage is applied to the electrode using a direct current power supply connected to the electrode.

8. The method of claim 6, wherein the negative voltage is applied to the electrode using a high frequency power supply connected to the electrode.

9. The method of claim 1, wherein the plasma generation period is one of a substrate processing period in which a substrate is processed with the generated plasma and a cleaning period in which particles are removed using the plasma, and
    wherein the method further comprises applying, during the cleaning period, a voltage having a polarity different from that of a voltage applied to the first electrode in the substrate processing period to the first electrode.

10. The method of claim 9 further comprising applying, during the cleaning period, a voltage having a polarity different from that of a voltage applied to the second electrode in the substrate processing period to the second electrode.

11. The method of claim 9 further comprising applying, during the cleaning period, a voltage having a polarity different from that of a voltage applied to the second electrode in the idle period to the second electrode.

* * * * *